US011181667B2

(12) United States Patent
Tsai et al.

(10) Patent No.: US 11,181,667 B2
(45) Date of Patent: Nov. 23, 2021

(54) OPTICAL MODULE COMPRISING A POLYMER LAYER WITH A LENS PORTION AND AN EXTENSION PORTION AND SPACER STACK

(71) Applicant: Facebook Technologies, LLC, Menlo Park, CA (US)

(72) Inventors: Jason Victor Tsai, Bellevue, WA (US); Michael Patrick Schaub, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/927,415

(22) Filed: Jul. 13, 2020

(65) Prior Publication Data
US 2021/0018657 A1    Jan. 21, 2021

Related U.S. Application Data

(60) Provisional application No. 62/874,452, filed on Jul. 15, 2019, provisional application No. 63/036,858, filed on Jun. 9, 2020.

(51) Int. Cl.
| | |
|---|---|
| *G02B 1/04* | (2006.01) |
| *G01J 1/04* | (2006.01) |
| *G01J 1/42* | (2006.01) |
| *H04N 5/225* | (2006.01) |

(52) U.S. Cl.
CPC ............ *G02B 1/041* (2013.01); *G01J 1/0403* (2013.01); *G01J 1/0411* (2013.01); *G01J 1/42* (2013.01); *H04N 5/2253* (2013.01); *H04N 5/2254* (2013.01)

(58) Field of Classification Search
CPC . G02C 7/083; G01J 1/42; G02B 1/041; H01L 27/14625; H04N 5/2253; H04N 5/2254
USPC ....................................... 250/208.1, 239, 216
See application file for complete search history.

(56) References Cited

U.S. PATENT DOCUMENTS

| | | | |
|---|---|---|---|
| 7,763,841 B1 * | 7/2010 | McEldowney | B29D 11/0073 250/216 |
| 9,933,601 B2 * | 4/2018 | Shi | H04N 5/2254 |
| 2009/0166511 A1 | 7/2009 | Kwon et al. | |
| 2015/0333094 A1 | 11/2015 | Wan et al. | |

FOREIGN PATENT DOCUMENTS

| | | |
|---|---|---|
| DE | 102004036469 A1 | 2/2006 |
| EP | 3007228 A1 | 4/2016 |

OTHER PUBLICATIONS

PCT/US2020/041925, "International Search Report and Written Opinion", dated Dec. 18, 2020, 18 pages.

* cited by examiner

*Primary Examiner* — Que Tan Le
(74) *Attorney, Agent, or Firm* — Kilpatrick Townsend & Stockton LLP

(57) ABSTRACT

In one example, an apparatus comprises: a lens assembly comprising one or more polymer layers, each layer including a lens portion and an extension portion and an image sensor positioned below the lens assembly and bonded to the lens assembly via a bonding layer and configured to sense light that passes through the lens portion of the one or more polymer layers.

19 Claims, 29 Drawing Sheets

OPTICAL MODULE COMPRISING A POLYMER LAYER WITH A LENS PORTION AND AN EXTENSION PORTION AND SPACER STACK

RELATED APPLICATION

This application claims priority to U.S. Provisional Application No. 62/874,452, filed on Jul. 15, 2019 and titled OPTICAL MODULE COMPRISING LENS ASSEMBLY, and U.S. Provisional Application No. 63/036,858, filed Jun. 9, 2020 and titled OPTICAL MODULE COMPRISING LENS ASSEMBLY, both of which are assigned to the assignee hereof and are incorporated herein by reference in their entirety for all purposes.

BACKGROUND

The disclosure relates generally to an optical module, and more specifically to an optical module comprising one or more lenses.

An optical module can include, for example, an image sensor module, a light projector module, etc. An image sensor module typically includes an image sensor, which can include one or more image sensor chips, and one or more lenses. The one or more lenses can gather incident light and focus the light towards a light receiving surface of the image sensor. The image sensor includes light sensing elements (e.g., photodiodes) that can receive the incident light that passes through the one or more lenses via the light receiving surface, and convert the received light to electrical signals. The electrical signals can represent, for example, intensities of light from a scene. Based on the electrical signals, an image processor can generate an image of the scene. On the other hand, a light projector module may include a light source and one or more lens. The light source can emit light, which can pass through the lens and propagate to a far field. The assembly of the one or more lenses with the image sensor/light source can affect various properties of the optical module.

SUMMARY

The disclosure relates generally to an optical module, and more specifically to an optical module comprising one or more lenses.

In one example, an apparatus is provided. The apparatus comprises: a lens assembly comprising one or more polymer layers, each layer including a lens portion and an extension portion; and an image sensor below the lens assembly and bonded to the lens assembly via a bonding layer and configured to sense light that passes through the lens portion of the one or more polymer layers.

In some aspects, each of the one or more polymer layers is made of a cyclic olefin copolymer (COC) material.

In some aspects, each of the one or more polymer layers is made of at least one of: a polycarbonate material, or a polyester material.

In some aspects, each of the one or more polymer layers is made from one or more injection molding processes.

In some aspects, a footprint of the lens assembly is substantially identical to a footprint of the image sensor.

In some aspects, the bonding layer is distributed around a perimeter of the image sensor to surround a light receiving surface of the image sensor facing the lens portions of the one or more polymer layers.

In some aspects, the lens assembly further comprises a light outputting surface. The bonding layer is distributed over a light receiving surface of the image sensor to bond the light receiving surface of the image sensor with the light outputting surface of the lens assembly.

In some aspects, the one or more polymer layers comprise a plurality of polymer layers. The extension portion of a pair of polymer layers of the plurality of polymer layers are bonded via an adhesive.

In some aspects, the one or more polymer layers comprise a plurality of polymer layers. The lens assembly further includes a plurality of spacers comprising a first spacer, the first spacer being sandwiched between the extension portion of a pair of polymer layers of the plurality of polymer layers.

In some aspects, the first spacer is bonded to the extension portion of the pair of polymer layers.

In some aspects, the plurality of spacers are made of an opaque material comprising one of: a polymer, or a metal.

In some aspects, the one or more polymer layers comprise a plurality of polymer layers. The lens portion of a pair of polymer layers of the plurality of polymer layers are bonded via an adhesive.

In some aspects, the apparatus further comprises an opaque coating on exterior surfaces of the lens assembly, wherein the exterior surfaces do not face the image sensor.

In some aspects, the apparatus further comprises an opaque lens holder to hold the one or more polymer layers. The opaque lens holder comprises a housing and a retainer. The housing is configured to hold the one or more polymer layers. The retainer is configured to retain the one or more polymer layers within the housing. The image sensor is bonded to either the housing or the retainer.

In some aspects, at least a part of the retainer is sandwiched between the housing and the image sensor.

In some aspects, the housing includes a first bottom surface surrounding a bottom opening of the housing facing the retainer and bonded with a top surface of the retainer via a first adhesive.

In some aspects, the retainer includes a middle surface to mount a filter, and a second bottom surface to bond with the image sensor via a second adhesive.

In some aspects, the first bottom surface of the housing comprises a first uneven surface. The top surface of the retainer comprises a second uneven surface. The first uneven surface and the second uneven surface are complimentary to each other and are bonded with each other via the first adhesive.

In some aspects, the housing comprises a barrel and a base portion. The base portion includes the first uneven surface to bond with the second uneven surface of the retainer.

In some aspects, the housing and the retainer are made of a polymer material using an injection molding process.

BRIEF DESCRIPTION OF THE DRAWINGS

Illustrative examples are described with reference to the following figures.

Figure 1A:
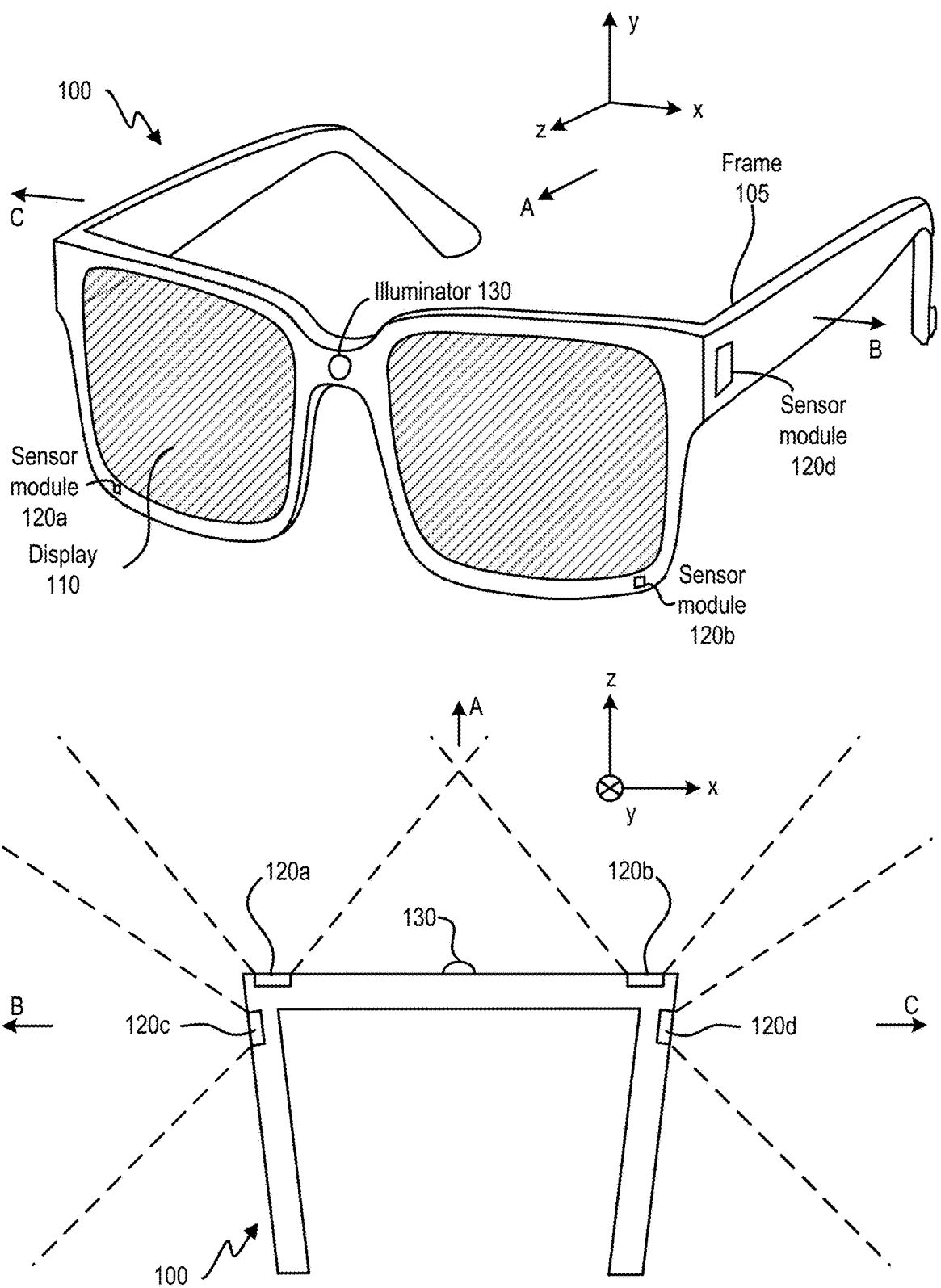
FIG. 1A, FIG. 1B, and FIG. 1C are diagrams of an example of a near-eye display.

The figures depict examples of the present disclosure for purposes of illustration only. One skilled in the art will readily recognize from the following description that alternative examples of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive examples. However, it will be apparent that various examples may be practiced without these specific details. The figures and description are not intended to be restrictive.

An optical module can include, for example, an image sensor module, a light projector module, etc. An image sensor module typically includes an image sensor and one or more lenses. The one or more lenses can gather incident light and focus the light towards a light receiving surface of the image sensor. The image sensor can include an array of pixel cells to generate electrical signals representing a distribution of light intensities received by the image sensor. Based on the electrical signals, an image processor can generate an image of the scene. The image sensor module can be soldered onto a printed circuit board (PCB) which also includes an image processor. The PCB include electrical traces to transmit the electrical signals from the image sensor module to the image sensor, which can generate an image of the scene based on the electrical signals. On the other hand, a light projector module may include a light source and one or more lens. The light source can be soldered onto a PCB and controlled by electrical signals from the PCB to emit light. The light can pass through the lens to become, for example, collimated light beams.

The physical properties of the lens of the optical module can determine the optical properties as well as the performance of the optical module. Specifically, the curvature and refractive index of the lens can determine the focal length of the lens, which can define the field of view of the image sensor module. The field of view, in turn, can determine an area of the scene to be captured by the image sensor module. Moreover, the Abbe number of the lens can determine the variation of refractive index versus wavelength. Further, the birefringence of the lens can determine the variation of the refractive index of the lens with respect to the polarization and propagation direction of the incident light. Both Abbe number and birefringence can control the dispersion of light by the lens and can be determined by the material of the lens. All these optical properties can affect the quality of an image (e.g., amount of information captured, blurriness, distortion) captured by the image sensor module, the dispersion of light produced by the light projector module, etc.

The assembly of the one or more lenses and the image sensor in the image sensor module can also affect the optical properties as well as the performance of the image sensor module. Specifically, the alignment of the image sensor with respect to the lens (e.g., relative orientations, positions) can also affect the reception of the light by the image sensor. For example, the light receiving surface of the image sensor needs to be at the focal point of the lens, and be perpendicular with the optical axis, so that different points of the light receiving surface can receive the focused light to enable the image sensor to have the field of view defined by the focal length of the one or more lenses. But if the light receiving surface of the image sensor is not at the focal point of the one or more lenses and/or not perpendicular to the optical axis, at least some locations of the light receiving surface may receive divergent/dispersed incident light, and the resulting image may become blurred and distorted. The performance of the light projector module can also be affected in a similar way by the alignment between the light source and the lens.

Moreover, the assembly of the lens with the image sensor in the image sensor module can also affect the footprint of the image sensor module. For example, a housing may be used to hold the lens and the image sensor together at their respective aligned positions and orientations. But if the housing surrounds the image sensor, the housing can add to the footprint of the image sensor module such that the image sensor module occupies a larger area on the PCB than the image sensor. The increased footprint can be undesirable especially for integrating the image sensor in a mobile device, such as a wearable device, a smart glass, etc., where space is very limited. The same is true for integrating a light projector in a mobile device.

This disclosure relates to an image sensor module that can provide improved optical properties as well as reduced form factor, as well as a method of fabricating the image sensor module. The image sensor module includes a lens assembly including one or more lenses, and an image sensor. Each of the plurality of lens can be held by a housing, which can be in the form of a barrel. The lenses can be separated by spacers to form a lens stack. The entire lens stack (including the housing, the spacers, etc.) can be positioned on the image sensor, with the lens holder and/or spacers defining the position of each lens in the lens stack with respect to the light receiving surface of the image sensor. The lens holder and the spacers can provide mechanical support and rigidity to prevent the deformation of lens stack, which can degrade the overall optical properties of the image sensor module, while not adding to the footprint of the image sensor module. The lens assembly can be bonded to a light receiving surface of the image sensor via a layer of adhesive, whereas the image sensor can be soldered onto a PCB. The light receiving surface can be on a glass substrate placed on the image sensor. As the entirety of the lens assembly is positioned on the image sensor, the footprint of the image sensor module (on the PCB) can be reduced to become substantially identical to the footprint of the image sensor.

In some examples, the one or more lenses of the lens assembly can be made of a polymer material (e.g., Cyclo Olefin Polymer) and can be fabricated using high precision processes such as injection molding. The high precision fabrication of the one or more lenses provide improved control of the physical properties (e.g., curvature, shape, size, etc.) of the lens, whereas the polymer material can reduce the Abbe number and the birefringence of the lens, both of which can provide improved control of the optical properties of the lens and the overall performance of the image sensor module.

In some examples, the optical elements of an image sensor module may include, in addition to the lenses stack, a filter. The filter can include a filter array to select different frequency components of the light to be detected by the image sensor, or a single frequency component of the light to be detected by all pixel cells. The image sensor includes light sensing elements (e.g., photodiodes) that can receive the different frequency components of the light selected by the filter array via the light receiving surface, and convert the frequency components to electrical signals. The electrical signals can represent, for example, intensities of the different frequency components of light from a scene. Moreover, the filter array can also be part of a projector to select the frequency range of output light, such as an infrared frequency range.

In a case where the image sensor module includes a filter, the image sensor module may include, in additional to the housing, a retainer. Both the housing and the retainer can be made of, for example, a polycarbonate (PC) material, a polymer material (e.g., liquid crystal polymer, LCP) using an injection molding process, etc., and can together form a holder structure. The filter can be mounted in the retainer, while the retainer can be mounted within the housing between the lenses stack and a bottom opening of the housing. Within the housing, the retainer can be positioned away from the bottom opening so that the retainer does not protrude out of the bottom opening. Moreover, the retainer is also pushed against the lenses stack. Such arrangements can provide additional physical support to the lenses stack and prevent the lenses stack from falling out of the bottom opening. A bottom surface of the housing around the bottom opening can be bonded (e.g., via an adhesive followed by ultraviolet light curing) onto the light receiving surface of the image sensor, to set the alignments and orientations of the lenses and the filter with respect to the image sensor. Light can then enter the housing via the top opening and become focused by the lenses stack and filtered by the filter. The filtered light can then exit out of the bottom opening and enter the image sensor.

With examples of the present disclosure, the footprint of the image sensor module can be reduced as the entirety of the lens assembly can be positioned on the image sensor. Moreover, the optical properties of the image sensor module can be improved by, for example, including lens that are fabricated using a high precision process (e.g., injection molding) and using materials that provide low birefringence and Abbe numbers. The alignment of the lens with respect to the image sensor can also be improved by the alignment process involving the light sensor operation by the image sensor as the data generated by the image sensor can provide an accurate account of the degree of alignment between the image sensor and the lens assembly.

Although the above arrangements can shrink the footprint of the image sensor module, the mounting of the retainer within the housing can create various issues which can affect the assembly of the image sensor module as well as the optical properties and performance of the image sensor module. Specifically, the bottom surface of the housing provides a very limited area for applying the adhesive, which makes the bonding of the housing to the image sensor difficult. Specifically, the bottom opening can be enlarged to allows more pixel cells to receive light through the lenses and filter, which can improve the imaging resolution. But the bottom surface of the housing, which surrounds the bottom opening and the retainer, adds to the footprint and may need to be shrunk to reduce the footprint of the image sensor module. As a result, the available area for applying the adhesive can be reduced. The reduced bonding area can lead to weaker bonding between the housing and the image sensor. Moreover, due to the reduced bonding area, the amount of adhesive applied, as well as the locations where the adhesive is applied, need to be controlled with very high precision. This is to prevent the adhesive applied to the bottom surface of the housing from spilling into the bottom opening when the housing and the image sensor are brought together. But the requisite precision may become unachievable as the footprint of the image sensor module continues to shrink. The weaker bonding between the housing and the image sensor can introduce variations in the alignments and orientations of the lenses and the filter with respect to the image sensor. Moreover, the adhesive spilled into the bottom opening can obfuscate the filter and/or the pixel cells of the image sensor. All these can degrade the light sensing performance of the image sensor module. In addition, by mounting the retainer within the housing, the bottom surface of the housing and the surface of the retainer add up and increases the footprint of the image sensor module.

In some examples, to further reduce the footprint of the image sensor and to further improve the bonding between the housing and image sensor, the retainer is mounted on a bottom surface of the housing at a bottom opening of the housing, and sandwiched between the housing and the image sensor, such that the housing, the retainer, and the image sensor forms a stack. The retainer includes a first surface to bond with the bottom surface of the housing. The first surface is also stacked against the lenses stack to provide additional physical support to the lenses, and to prevent the lenses stack from falling out of the bottom opening. The retainer further includes a second surface opposite from the first surface. The second surface can be bonded to the light receiving surface of the image sensor via, for example, an adhesive.

With the disclosed techniques in which the housing, the retainer, and the image sensor form a stack. Such arrangements can reduce the surface area surrounding the filter and the footprint of the image sensor module. Moreover, the retainer surface can be made larger to provide a larger area for applying the adhesive for bonding with the image sensor, which can improve the bonding between the retainer and the image sensor and relax the precision requirements for application of adhesive. As the retainer does not surround the lenses stack, unlike the housing, the retainer surface can be increased without a corresponding increase in the footprint of the image sensor module. As a result, the footprint of the image sensor module can be reduced, while the bonding between the image sensor and the holder structure (including the housing and the retainer) can be improved to provide improve control of the alignments and orientations of the lenses and the filter with respect to the image sensor. All of these can further reduce the footprint and improve the performance of the image sensor module.

The image sensor can be bonded to the lens assembly, which may include the housing, the lenses stack, the filter, etc., via a layer of adhesive. The image sensor can be bonded to the housing directly, or to the retainer of the filter, of the lens assembly. Prior to the bonding, the image sensor can be soldered onto the PCB via a reflow process which typically occurs at a high temperature, to prevent the reflow process from deforming the lens in the lens assembly. During the fabrication of the image sensor module, the adhesive can be applied on the lens assembly and/or the image sensor, and the image sensor can be attached to the lens assembly via the adhesive to form the bonding. While the adhesive is still in a liquid state, an alignment process involving an light sensing operation by the image sensor can be performed to adjust the position and/or orientation of the image sensor with respect to the lens assembly. In the alignment process, light can be projected to the lens assembly, and the image sensor can be operated to generate sensor data based on the light that passes through the lens assembly. The sensor data can reflect a degree of alignment (e.g., based on a measurement of blurriness, distortion) between the lens assembly and the image sensor. The position and/or orientation of the image sensor can be adjusted until, for example, a target alignment is achieved. The image sensor can then be fixed at its aligned position/orientation based on curing the adhesive to harden the adhesive. The adhesive can be cured by, for example, ultraviolet light, a thermal process at a temperature lower than the melting point of the one or more lenses, etc., such that the curing process also does not deform the lens. The techniques described above can also be used to form a light projector system with reduced footprint and improved performance.

The disclosed techniques may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some examples, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1A is a diagram of an example of a near-eye display 100. Near-eye display 100 presents media to a user. Examples of media presented by near-eye display 100 include one or more images, video, and/or audio. In some examples, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some examples, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some examples, display 110 comprises a waveguide display assembly for directing light from one or more images to an eye of the user.

Near-eye display 100 further includes image sensor modules 120a, 120b, 120c, and 120d. Each of image sensor modules 120a, 120b, 120c, and 120d may include a pixel array configured to generate image data representing different fields of views along different directions. For example, sensor modules 120a and 120b may be configured to provide image data representing two fields of view towards a direction A along the Z axis, whereas sensor 120c may be configured to provide image data representing a field of view towards a direction B along the X axis, and sensor 120d may be configured to provide image data representing a field of view towards a direction C along the X axis.

In some examples, sensor modules 120a-120d can be configured as input devices to control or influence the display content of the near-eye display 100, to provide an interactive VR/AR/MR experience to a user who wears near-eye display 100. For example, sensor modules 120a-120d can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some examples, the location tracking system may operate a simultaneous localization and mapping algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensor modules 120a-120d can provide the location tracking system a more holistic view of the physical environment, which can lead to more objects to be included in the construction and updating of the map. With such an arrangement, the accuracy and robustness of tracking a location of the user within the physical environment can be improved.

In some examples, near-eye display 100 may further include one or more active illuminators 130 to project light into the physical environment. The light projected can be associated with different frequency spectrums (e.g., visible light, infrared light, ultraviolet light, etc.), and can serve various purposes. For example, illuminator 130 may project light in a dark environment (or in an environment with low intensity of infrared light, ultraviolet light, etc.) to assist sensor modules 120a-120d in capturing images of different objects within the dark environment to, for example, enable location tracking of the user. Illuminator 130 may project certain markers onto the objects within the environment, to assist the location tracking system in identifying the objects for map construction/updating.

In some examples, illuminator 130 may also enable stereoscopic imaging. For example, one or more of sensor modules 120a or 120b can include both a first pixel array for visible light sensing and a second pixel array for infrared (IR) light sensing. The first pixel array can be overlaid with a color filter (e.g., a Bayer filter), with each pixel of the first pixel array being configured to measure intensity of light associated with a particular color (e.g., one of red, green or blue colors). The second pixel array (for IR light sensing) can also be overlaid with a filter that allows only IR light through, with each pixel of the second pixel array being configured to measure intensity of IR lights. The pixel arrays can generate a red-green-blue (RGB) image and an IR image of an object, with each pixel of the IR image being mapped to each pixel of the RGB image. Illuminator 130 may project a set of IR markers on the object, the images of which can be captured by the IR pixel array. Based on a distribution of the IR markers of the object as shown in the image, the system can estimate a distance of different parts of the object from the IR pixel array, and generate a stereoscopic image of the object based on the distances. Based on the stereoscopic image of the object, the system can determine, for example, a relative position of the object with respect to the user, and can update the image data provided to display 100 based on the relative position information to provide the interactive experience.

As discussed above, near-eye display 100 may be operated in environments associated with a very wide range of light intensities. For example, near-eye display 100 may be operated in an indoor environment or in an outdoor environment, and/or at different times of the day. Near-eye display 100 may also operate with or without active illuminator 130 being turned on. As a result, image sensor modules 120a-120d may need to have a wide dynamic range to be able to operate properly (e.g., to generate an output that correlates with the intensity of incident light) across a very wide range of light intensities associated with different operating environments for near-eye display 100.

Figure 1B:
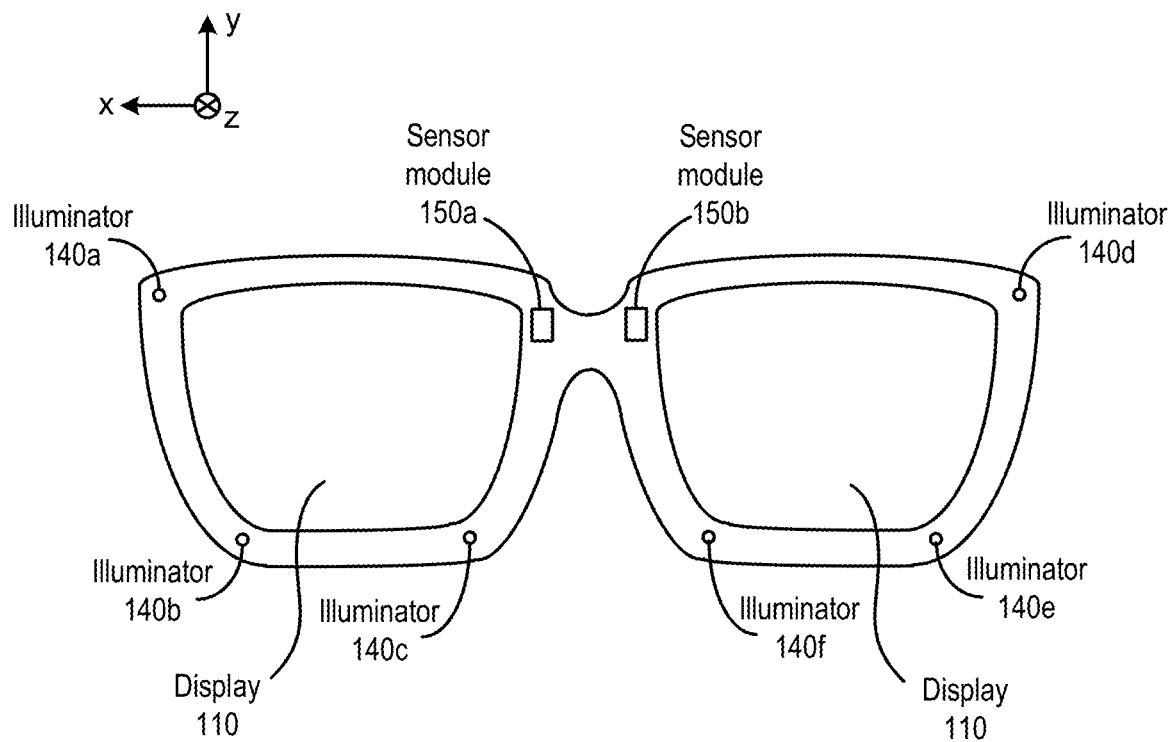
Figure 1B:
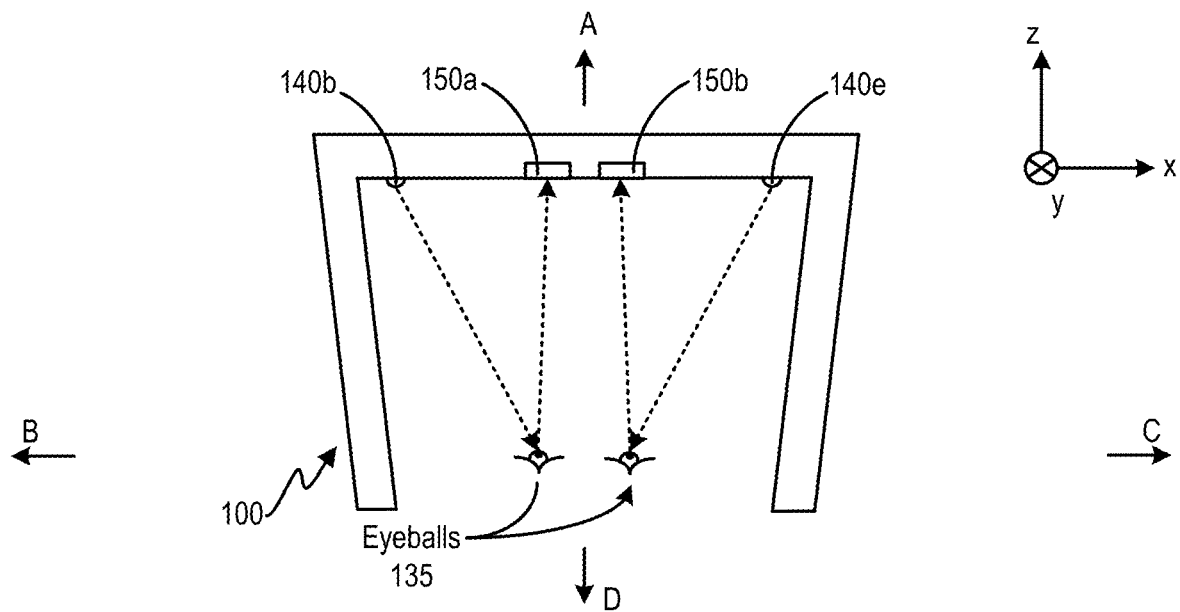

FIG. 1B is a diagram of another example of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140a, 140b, 140c, 140d, 140e, and 140f. Near-eye display 100 further includes a plurality of image sensor modules 150a and 150b. Illuminators 140a, 140b, and 140c may emit lights of certain frequency range (e.g., near infrared range (NIR)) towards direction D (which is opposite to direction A of FIG. 1A). The emitted light may be associated with a certain pattern, and can be reflected by the left eyeball of the user. Sensor module 150a may include a pixel array to receive the reflected light and generate an image of the reflected pattern. Similarly, illuminators 140d, 140e, and 140f may emit NIR lights carrying the pattern. The NIR lights can be reflected by the right eyeball of the user, and may be received by sensor module 150b. Sensor module 150b may also include a pixel array to generate an image of the reflected pattern. Based on the images of the reflected pattern from sensor modules 150a and 150b, the system can determine a gaze point of the user, and update the image data provided to display 100 based on the determined gaze point to provide an interactive experience to the user.

As discussed above, to avoid damaging the eyeballs of the user, illuminators 140a, 140b, 140c, 140d, 140e, and 140f are typically configured to output lights of very low intensities. In a case where image sensor modules 150a and 150b comprise the same sensor devices as image sensor modules 120a-120d of FIG. 1A, the image sensor modules 120a-120d may need to be able to generate an output that correlates with the intensity of incident light when the intensity of the incident light is very low, which may further increase the dynamic range requirement of the image sensor modules.

Moreover, the image sensor modules 120a-120d may need to be able to generate an output at a high speed to track the movements of the eyeballs. For example, a user's eyeball can perform a very rapid movement (e.g., a saccade movement) in which there can be a quick jump from one eyeball position to another. To track the rapid movement of the user's eyeball, image sensor modules 120a-120d need to generate images of the eyeball at high speed. For example, the rate at which the image sensor modules generate an image frame (the frame rate) needs to at least match the speed of movement of the eyeball. The high frame rate requires short total exposure time for all of the pixel cells involved in generating the image frame, as well as high speed for converting the sensor outputs into digital values for image generation. Moreover, as discussed above, the image sensor modules also need to be able to operate at an environment with low light intensity.

Figure 1C:
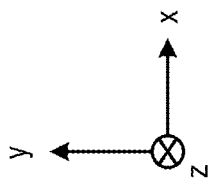
Figure 1C:
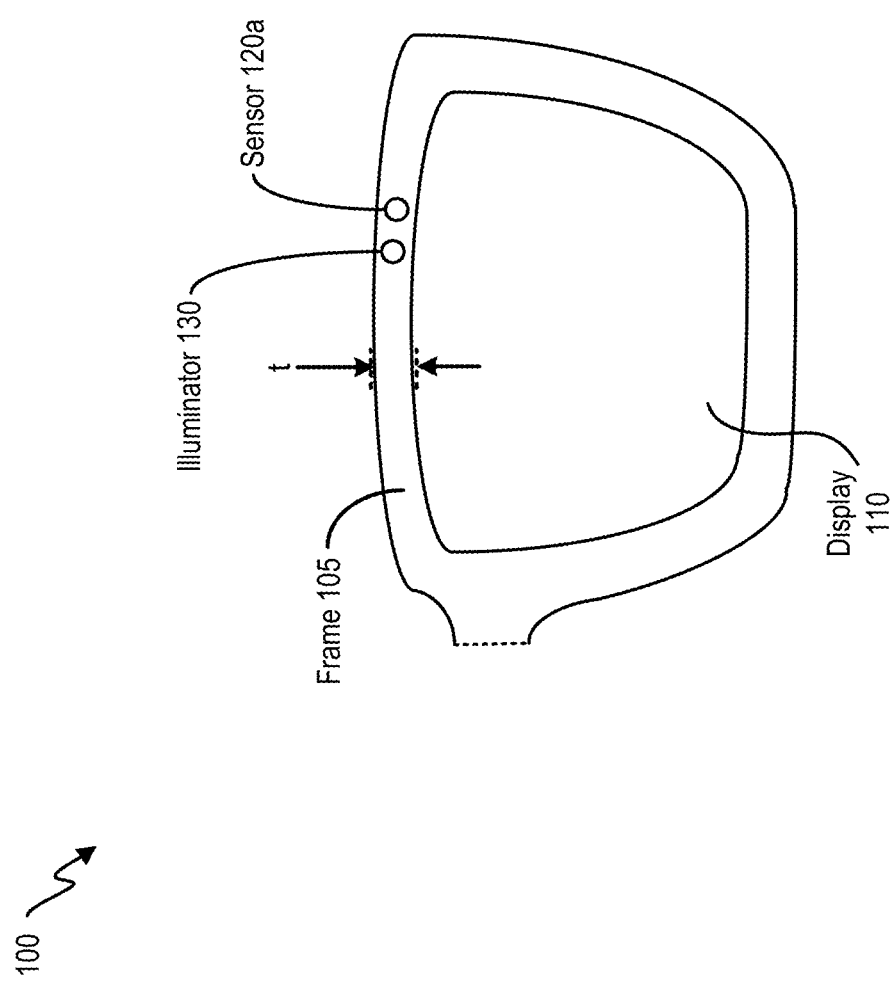

FIG. 1C illustrates a close-up view of near-eye display 100. As shown in FIG. 1C, frame 105 may house image sensor module 120a and illuminator 130. Image sensor module 120a and illuminator 130 may be connected to a printed circuit board (PCB) which provides electrical connections between different subsystems of near-eye display 100. The footprint of image sensor module 120a (e.g., along the x and y axes) on PCB 160, as well as other subsystems connected to PCB 160 can determine a thickness (labelled "t" in FIG. 1C) of frame 105 needed to house PCB 160. It may be desirable to reduce the thickness of frame 105 to reduce the weight of frame 105, to increase the area of display 110, and to improve aesthetics, all of which can improve the user experience. To reduce the thickness of frame 105, the footprints of the sub-systems on PCB 160, such as image sensor module 120a, illuminator 130, etc., may need to be reduced.

Figure 2:
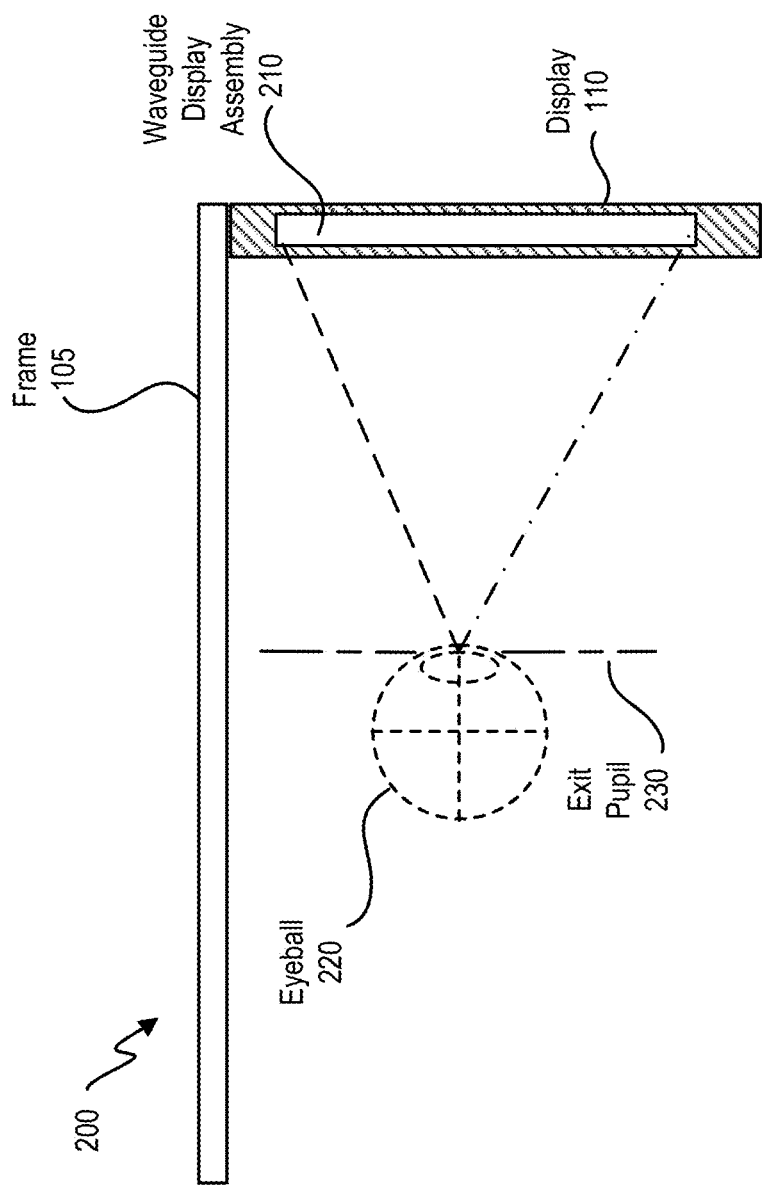
FIG. 2 is an example of a cross section of the near-eye display.

FIG. 2 is an example of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some examples, near-eye display 100 includes one or more optical elements between waveguide display assembly 210 and eyeball 220.

In some examples, waveguide display assembly 210 includes a stack of one or more waveguide displays including, but not restricted to, a stacked waveguide display, a varifocal waveguide display, etc. The stacked waveguide display is a polychromatic display (e.g., a RGB display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate examples, waveguide display assembly 210 may include the stacked waveguide display and the varifocal waveguide display.

Figure 3:
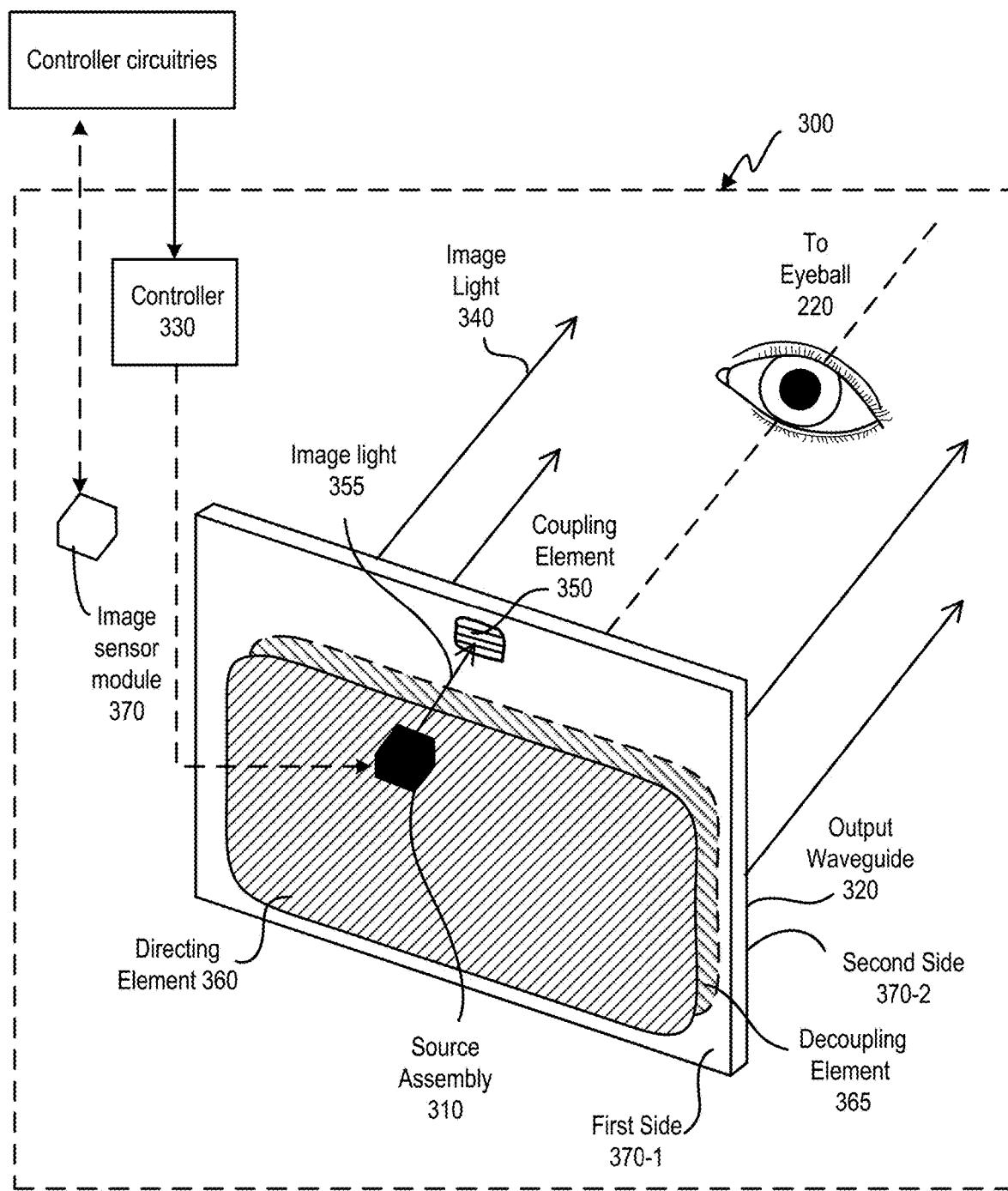
FIG. 3 illustrates an isometric view of an example of a waveguide display with a single source assembly.

FIG. 3 illustrates an isometric view of an example of a waveguide display 300. In some examples, waveguide display 300 is a component (e.g., waveguide display assembly 210) of near-eye display 100. In some examples, waveguide display 300 is part of some other near-eye display or other system that directs image light to a particular location.

Waveguide display 300 includes a source assembly 310, an output waveguide 320, and a controller 330. For purposes of illustration, FIG. 3 shows the waveguide display 300 associated with a single eyeball 220, but in some examples, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some examples, coupling element 350 couples the image light 355 from source assembly 310 into output waveguide 320. Coupling element 350 may be, for example, a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, for example, a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of for example, silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some examples, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor module 370. Image sensor module 370 may be located on first side 370-1 and may include, for example, image sensor modules 120a-120d of FIG. 1A to generate image data of a physical environment in front of the user (e.g., for location determination). Image sensor module 370 may also be located on second side 370-2 and may include image sensor modules 150a and 150b of FIG. 1B to generate image data of eyeball 220 (e.g., for gaze point determination) of the user. Image sensor module 370 may interface with a remote console that is not located within waveguide display 300. Image sensor module 370 may provide image data to the remote console, which may determine, for example, a location of the user, a gaze point of the user, etc., and determine the content of the images to be displayed to the user. The remote console can transmit instructions to controller 330 related to the determined content. Based on the instructions, controller 330 can control the generation and outputting of image light 355 by source assembly 310.

Figure 4:
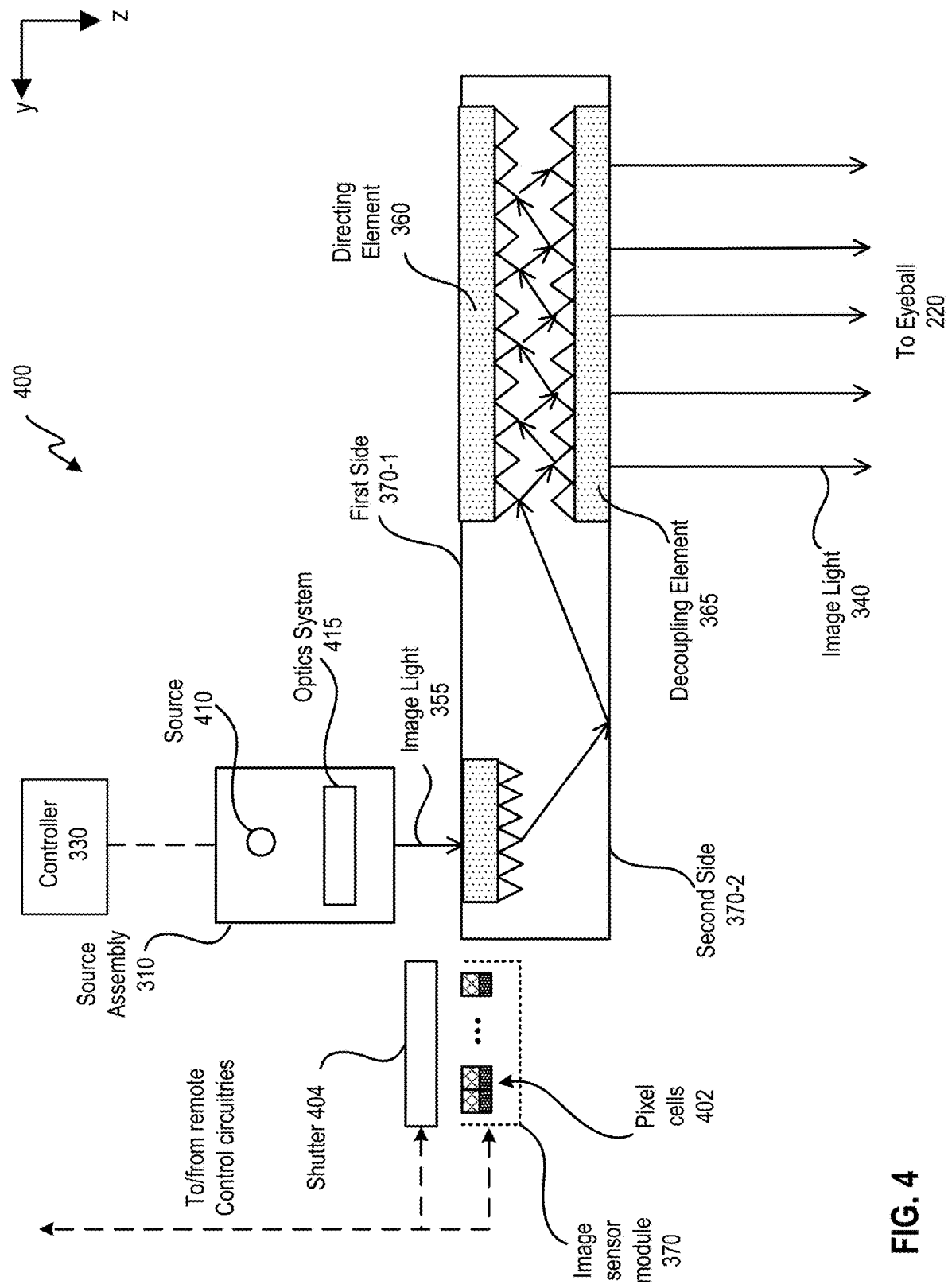
FIG. 4 illustrates a cross section of an example of the waveguide display.

FIG. 4 illustrates an example of a cross section 400 of the waveguide display 300. The cross section 400 includes source assembly 310, output waveguide 320, and image sensor module 370. In the example of FIG. 4, image sensor module 370 may include a set of pixel cells 402 located on first side 370-1 to generate an image of the physical environment in front of the user. In some examples, there can be a mechanical shutter 404 interposed between the set of pixel cells 402 and the physical environment to control the exposure of the set of pixel cells 402. In some examples, the mechanical shutter 404 can be replaced by an electronic shutter gate, as to be discussed below. Each of pixel cells 402 may correspond to one pixel of the image. Although not shown in FIG. 4, it is understood that each of pixel cells 402 may also be overlaid with a filter to control the frequency range of the light to be sensed by the pixel cells.

After receiving instructions from the remote console, mechanical shutter 404 can open and expose the set of pixel cells 402 in an exposure period. During the exposure period, image sensor module 370 can obtain samples of lights incident on the set of pixel cells 402, and generate image data based on an intensity distribution of the incident light samples detected by the set of pixel cells 402. Image sensor module 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, for example, a laser diode, a vertical cavity surface emitting laser, and/or a light emitting diode.

Optics system 415 includes one or more optical components that condition the light from source 410. Conditioning light from source 410 may include, for example, expanding, collimating, and/or adjusting orientation in accordance with instructions from controller 330. The one or more optical components may include one or more lenses, liquid lenses, mirrors, apertures, and/or gratings. In some examples, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In examples where coupling element 350 is diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In examples where directing element 360 is a diffraction grating, the pitch of the diffraction grating is chosen to cause incident image light 355 to exit output waveguide 320 at angle(s) of inclination relative to a surface of decoupling element 365.

In some examples, directing element 360 and/or decoupling element 365 are structurally similar. Expanded image light 340 exiting output waveguide 320 is expanded along one or more dimensions (e.g., may be elongated along x-dimension). In some examples, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
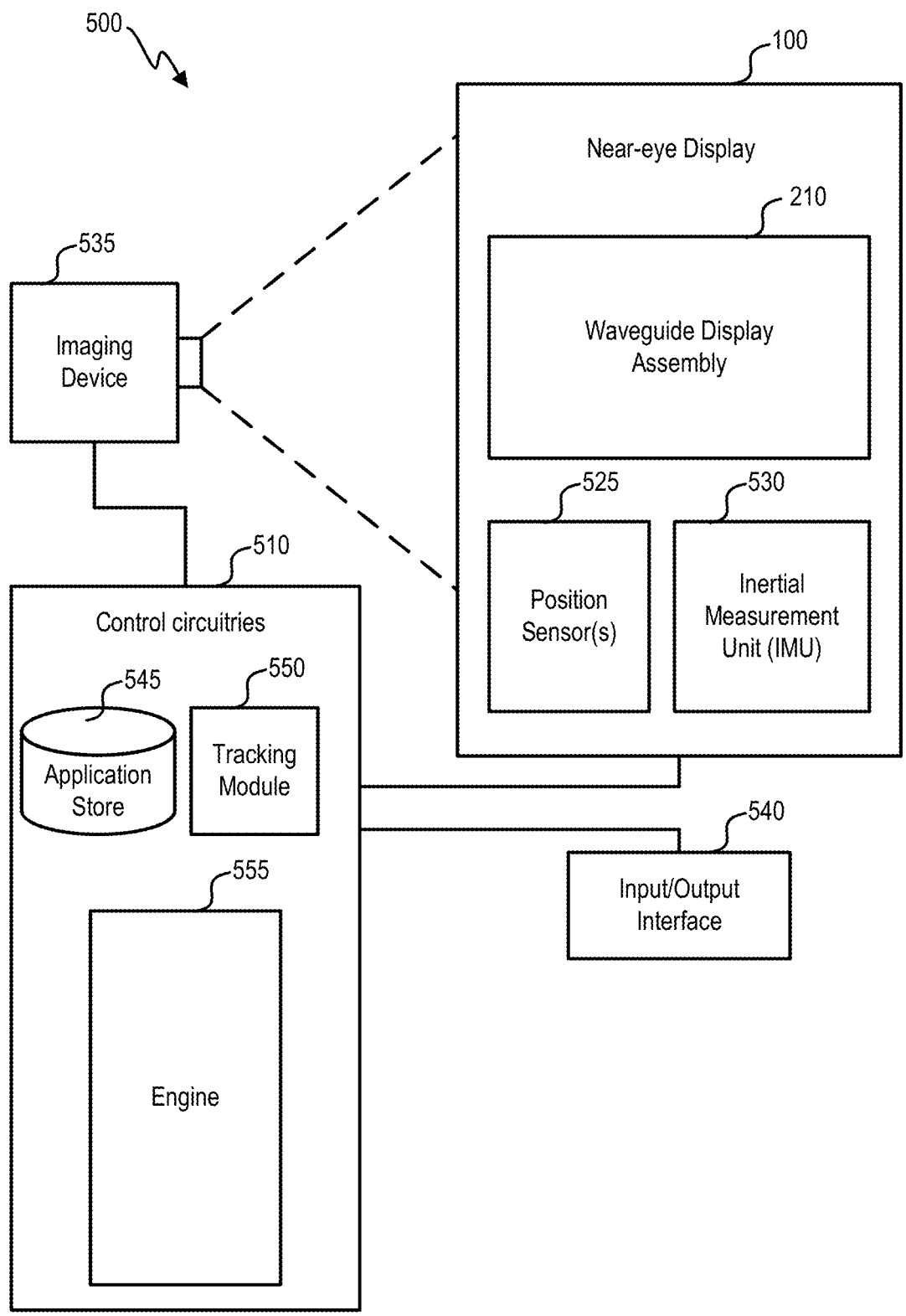
FIG. 5 is a block diagram of an example of a system including the near-eye display.

FIG. 5 is a block diagram of an example of a system 500 including the near-eye display 100. The system 500 comprises near-eye display 100, an imaging device 535, an input/output interface 540, and image sensor modules 120a-120d and 150a-150b that are each coupled to control circuitries 510. System 500 can be configured as a head-mounted device, a wearable device, etc.

Near-eye display 100 is a display that presents media to a user. Examples of media presented by the near-eye display 100 include one or more images, video, and/or audio. In some examples, audio is presented via an external device (e.g., speakers and/or headphones) that receives audio information from near-eye display 100 and/or control circuitries 510 and presents audio data based on the audio information to a user. In some examples, near-eye display 100 may also act as an AR eyewear glass. In some examples, near-eye display 100 augments views of a physical, real-world environment, with computer-generated elements (e.g., images, video, sound, etc.).

Near-eye display 100 includes waveguide display assembly 210, one or more position sensor modules 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensor modules 525.

Imaging device 535 may generate image data for various applications. For example, imaging device 535 may generate image data to provide slow calibration data in accordance with calibration parameters received from control circuitries 510. Imaging device 535 may include, for example, image sensor modules 120a-120d of FIG. 1A for generating image data of a physical environment in which the user is located, for performing location tracking of the user. Imaging device 535 may further include, for example, image sensor modules 150a-150b of FIG. 1B for generating image data for determining a gaze point of the user, to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provide media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions, that, when executed by a processor, generates content for presentation to the user. Examples of applications include: gaming applications, conferencing applications, video playback applications, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some examples, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), or a gaze point of the user (e.g., based on image data provided by imaging device 535), a distance between an object and user (e.g., based on image data provided by imaging device 535).

Figure 6A:
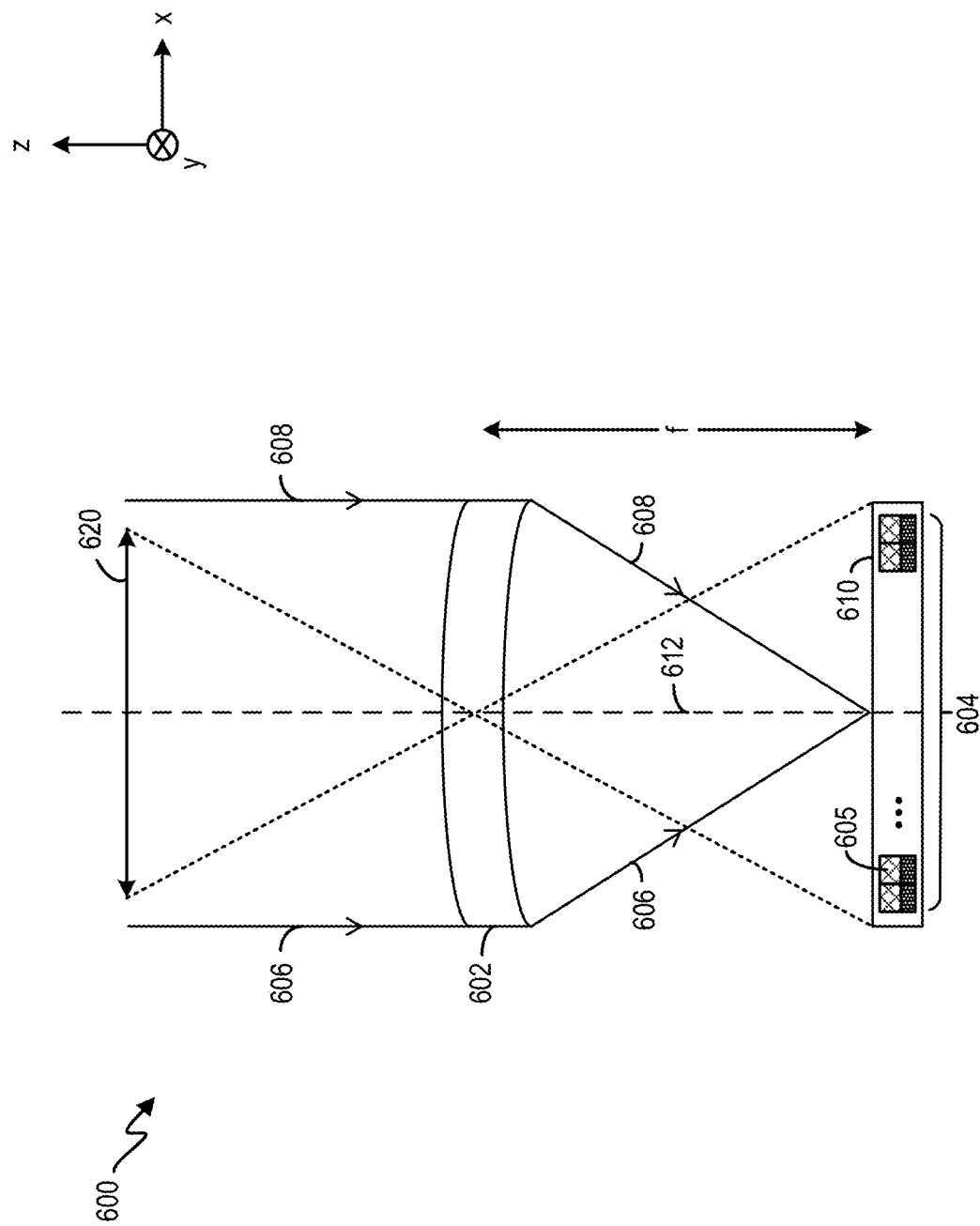
FIG. 6A and FIG. 6B illustrates examples of an image sensor module and its operations.
Figure 6B:
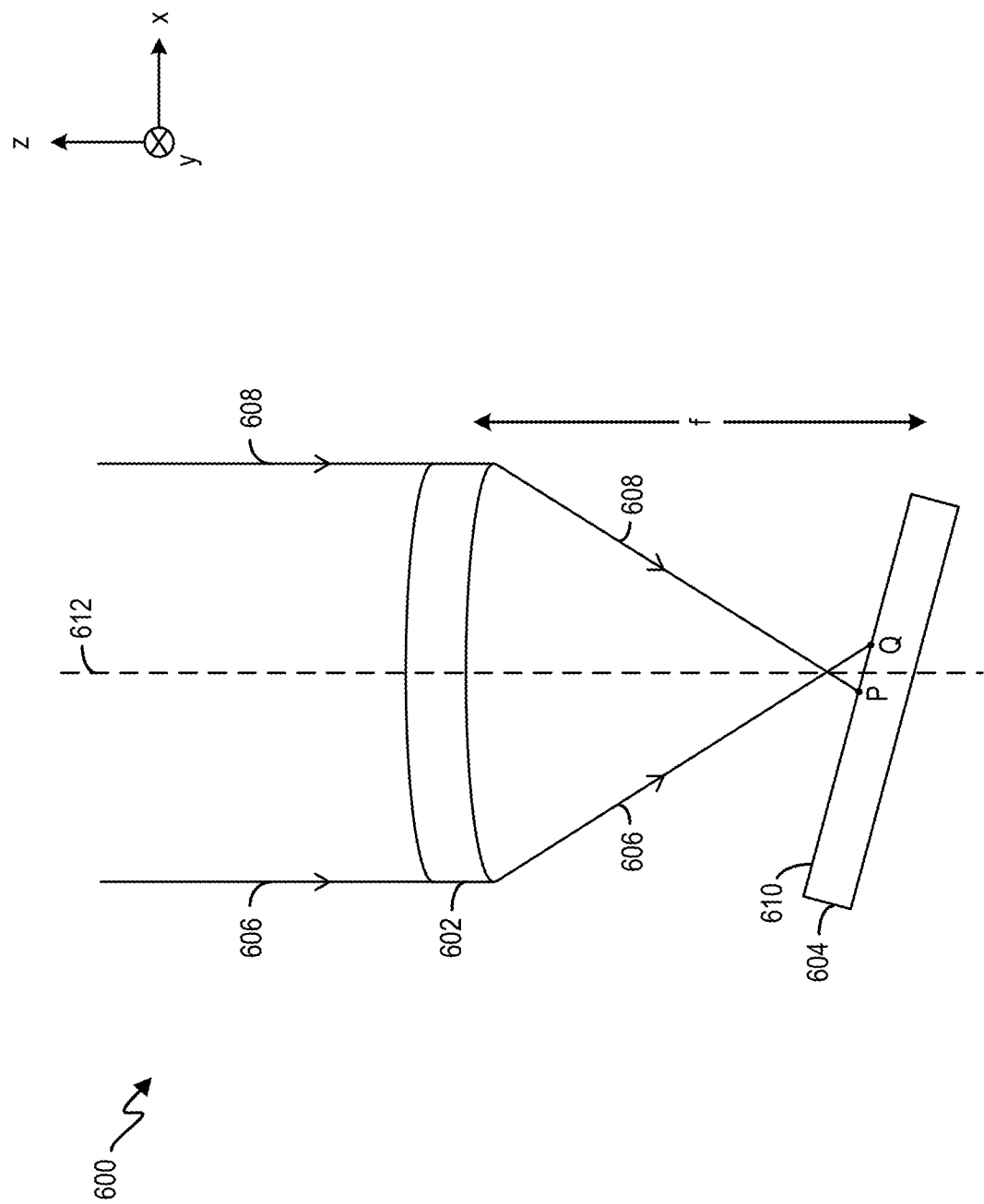

FIG. 6A and FIG. 6B illustrate examples of an image sensor module 600 and its operations. Image sensor module 600 can be part of image sensor modules 120a-120d and 150a-150b of FIG. 1A and FIG. 1B, and part of image sensor module 370 of FIG. 3. As shown in FIG. 6A, image sensor module 600 includes one or more lenses 602 and an image sensor 604, which can include one or more image sensor dies/chips. One or more lenses 602 can include a single lens 602 (e.g., as shown in FIG. 6A and FIG. 6B) or multiple lens aligned in a stack along a propagation direction of light (e.g., along the z-axis). One or more lenses 602 can gather light 606 and light 608 and focus light 606 and light 608 towards image sensor 604. Image sensor 604 includes a light receiving surface 610 to receive the focused light 606. Light receiving surface 610 can be separated from lens 602 by a distance f. The distance f in FIG. 6A can correspond to a distance between lens 602 and image sensor 604 for capturing an image of an object at an infinite distance away from lens 602. Distance f can be adjusted based on, for example, the distance between the object and lens 602. Provided that light receiving surface 610 is at distance f from lens 602, that light receiving surface 610 is perpendicular to the optical axis 612 of lens 602, and that center of light receiving surface 610 aligns with optical axis 612, light receiving surface 610 can receive focused light with a field of view 620 defined based on the length f of lens 602. Image sensor 604 further includes an array of pixel cells 605 below the light receiving surface 610 to convert the focused light 606 to electrical signals. Different pixel cells may receive different intensities of light via lens 602 to generate the electrical signals, and an image of field of view 620 can be constructed based on the electrical signals from the pixel cells.

The optical properties of Image sensor module 600, such as field of view 620, can be determined by the physical properties of lens 602. Specifically, the curvature and refractive index of lens 602 can determine the focal length f. Moreover, the Abbe number of lens 602 can determine the variation of refractive index versus wavelength. Further, the birefringence of lens 602 can determine the variation of the refractive index of the lens with respect to the polarization and propagation direction of the incident light. Both Abbe number and birefringence can control the dispersion of light 606 by lens 602 and can be determined by the material of lens 602. All these optical properties can affect the quality of an image (e.g., amount of information captured in the field of view, blurriness and distortion caused by the dispersion of light) captured by the image sensor module 600.

The assembly of one or more lenses 602 and image sensor 604 in image sensor module 600 can also affect the optical properties as well as the performance of image sensor module 600. Specifically, the alignment of the image sensor with respect to the lens (e.g., relative orientations, positions) can also affect the reception of the light by image sensor 604. As described above, for proper alignment, light receiving surface 610 should be separated from lens 602 by the distance f. Moreover, light receiving surface 610 should be perpendicular to the optical axis 612 of lens 602, whereas the center of light receiving surface 610 should align with optical axis 612. FIG. 6B illustrates examples of misalignment between lens 602 and image sensor 604 and their effects. As shown in FIG. 6B, image sensor 604 (and light receiving surface 610) can become tilted with respect to optical axis 612 and lens 602. As a result, various locations of light receiving surface 610 (e.g., locations labelled "P" and "Q") may be separated from lens 602 by a distance that is either shorter than or longer than distance f. As a result, light receiving surface 610 may receive dispersed light 606 at locations P and Q, and the resulting image may appear to be out-of-focus at those locations and become distorted. In addition, the center of light receiving surface 610 does not align with optical axis 612, which can reduce the field of view captured by light receiving surface 610.

Figure 7:
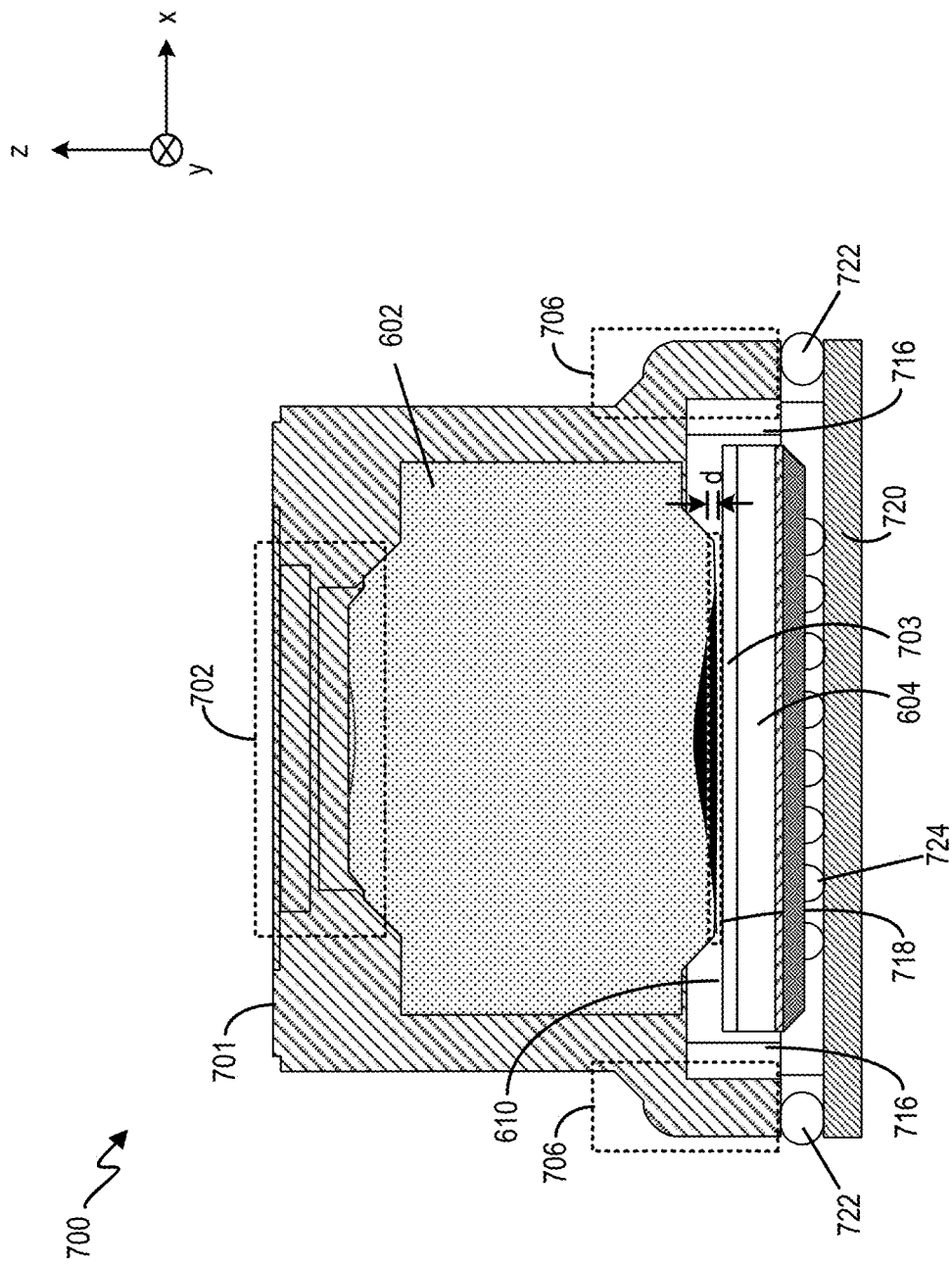
FIG. 7 illustrates other examples of an image sensor module.

FIG. 7 illustrates an example of an image sensor module 700 that can provide improved alignment between lens 602 and image sensor 604. As shown in FIG. 7, image sensor module 700 includes a housing 701 that houses one or more lenses 602, a substrate 703 (e.g., a glass substrate), and image sensor 604. One or more lenses 602 can include multiple lenses forming a lens stack and mounted on the internal wall of housing 701. Housing 701 further includes a shoulder structure 706 that are on the vertical sides of image sensor 604 (e.g., sides that are perpendicular to light receiving surface 610). There can be an air gap 716 between the vertical sides of image sensor 604 and shoulder structure 706, and an air gap 718 between one or more lenses 602 and light receiving surface 610 of image sensor 604. Both air gaps 716 and 718 can provide space for aligning one or more lenses 602 with respect to image sensor 604.

Both housing 701 and image sensor 604 are bonded onto a PCB 720. For example, shoulder structure 706 can be bonded to PCB 720 via an adhesive bondline 722, whereas image sensor 604 can be soldered onto PCB 720 via solder balls 724 to form conductive bonds. Bondline 722 can be used to align one or more lenses 602 with respect to image sensor 604. Specifically, bondline 722 can include adhesives that are flexible when in a liquid state but can become hardened when cured. When bondline 722 is in a liquid state, housing 701 (with one or more lenses 602 mounted within) can be moved in the x, y, and z directions and/or rotated around the x, y, and z axes to align with image sensor 604. The target alignment can be such that, for example, optical axis 612 of one or more lenses 602 aligns with the center of the image sensor 604, light receiving surface 610 is perpendicular to the optical axis 612 and is separated from one or more lenses 602 by a pre-determined distance d, etc. Once the target alignment is achieved, the adhesives can be cured to form bondline 722 to fix the location and orientation of the one or more lenses 602 with respect to image sensor 604.

Although housing 701 of FIG. 7 can provide improved alignment between one or more lenses 602 and image sensor 604, the shoulder structure 706 of housing 701 increases the footprint of image sensor module 700, which is undesirable for a wearable device such as near-eye display 100. As explained above, the increased footprint of image sensor module 700 can lead to increase in the thickness of frame 105, which can increase the weight of frame 105, reduce the area of display 110, and affect aesthetics, all of which can degrade the user experience. Meanwhile, in order to shrink the footprint of image sensor module 700, the footprint of image sensor 604 may need to shrink, which can reduce the number of pixel cells included in image sensor 604 and reduce the resolution of image capture. The performance of image sensor module 700 may be degraded as a result.

Figure 8A:
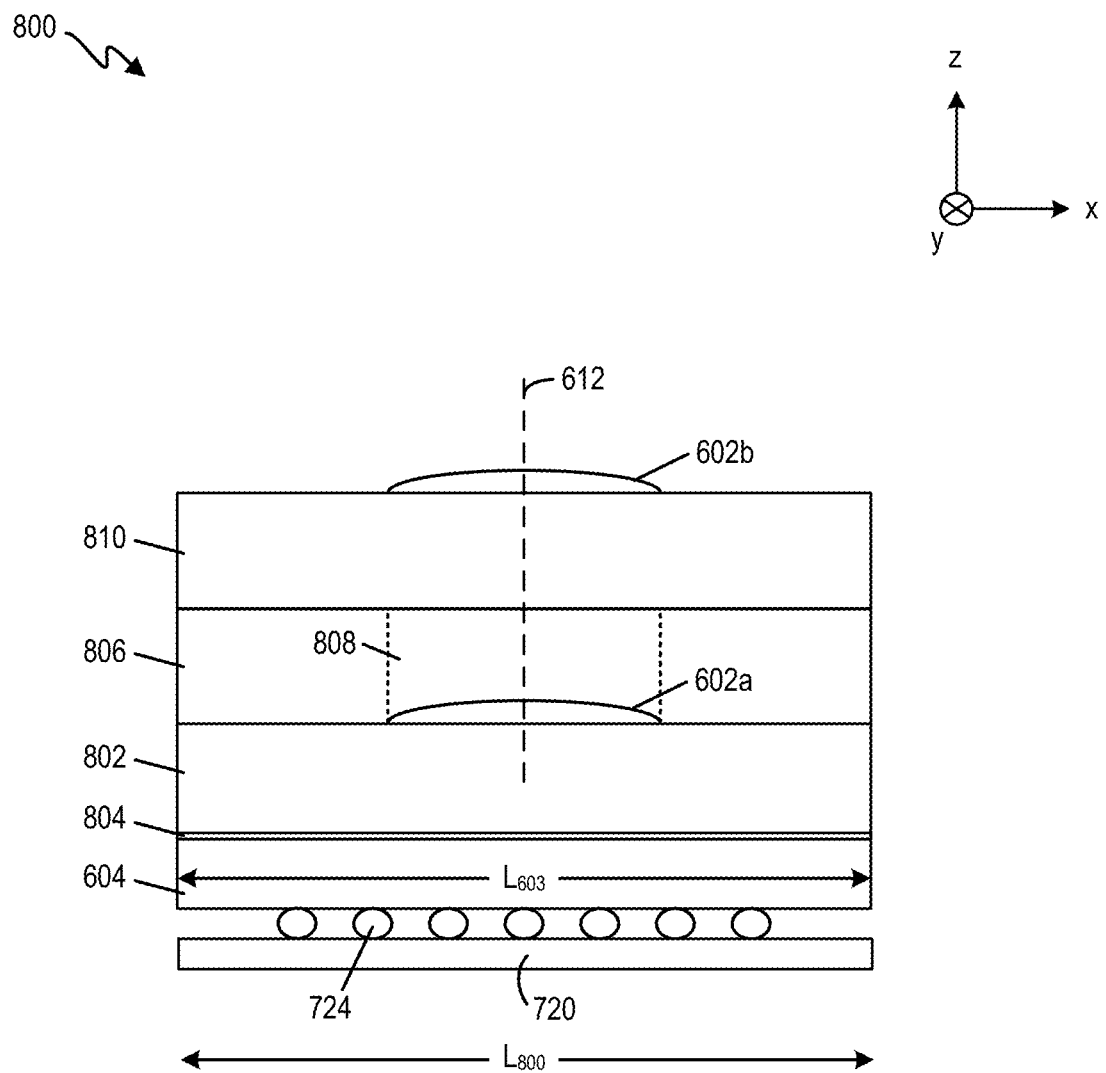
FIG. 8A, FIG. 8B, and FIG. 8C illustrates other examples of an image sensor module and its fabrication.
Figure 8B:
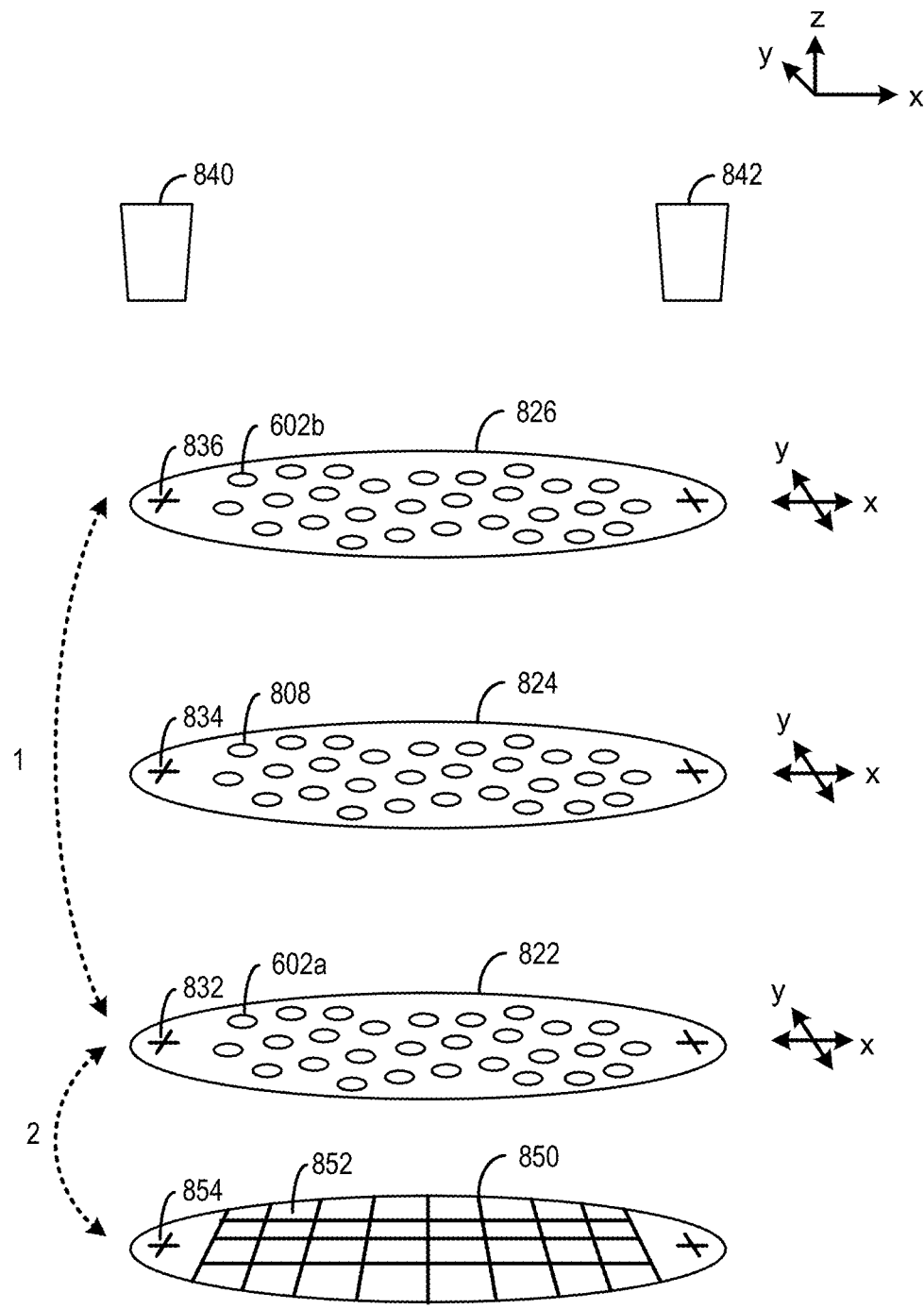
Figure 8C:
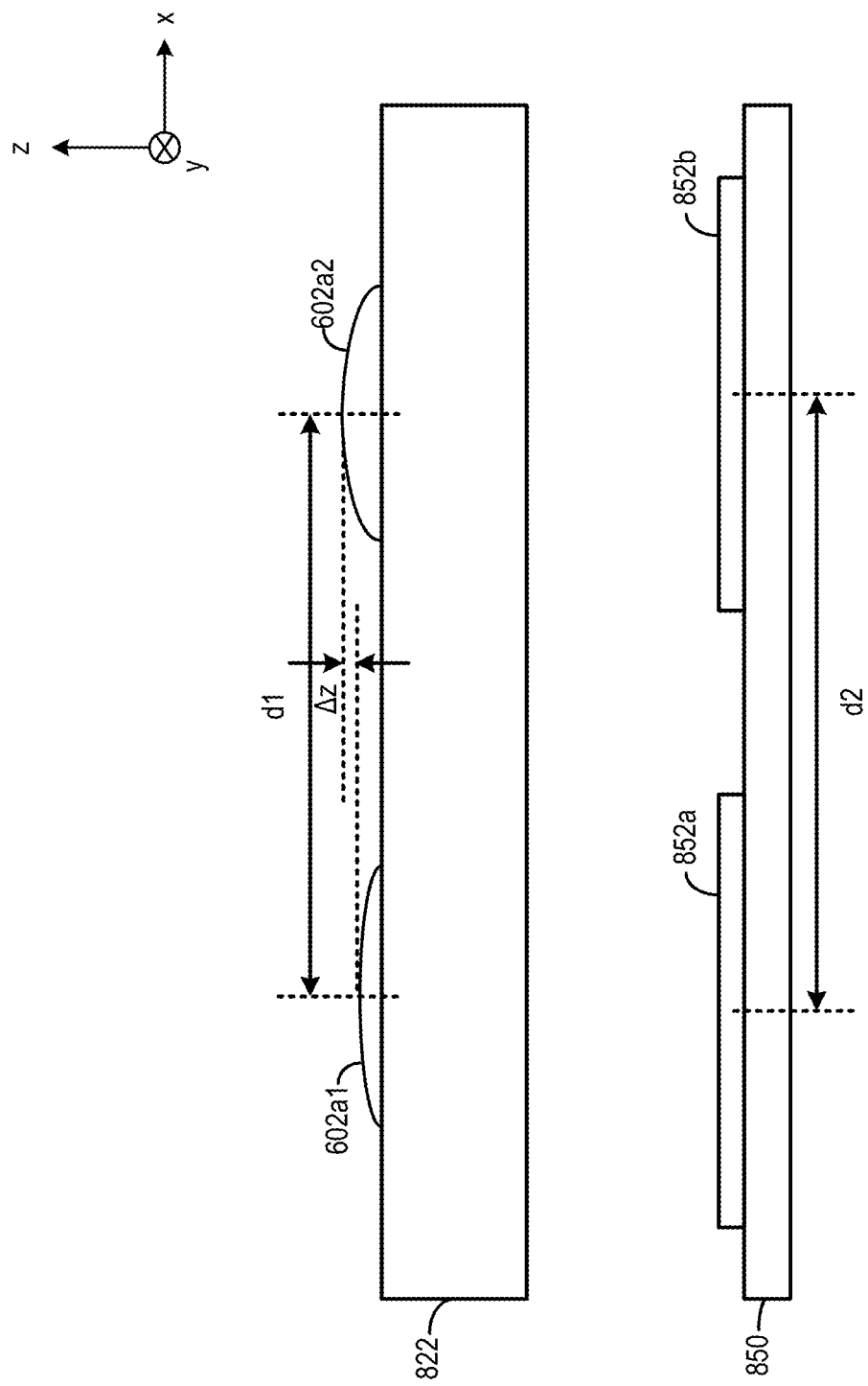

FIG. 8A illustrates another example of an image sensor module 800 with reduced footprint, whereas FIG. 8B and FIG. 8C illustrate an example fabrication method of image sensor module 800. As shown in FIG. 8B, image sensor module 800 may include lens 602a (of one or more lenses 602) formed on a glass substrate 802. Glass substrate 802 can be bonded to image sensor 604 via, for example, an bonding layer 804. Additional glass substrates can be stacked on top of glass substrate 802 to include additional lens. For example, a glass substrate 806 having a cavity 808 can be stacked on top of glass substrate 802 with cavity 808 accommodating lens 602a, and another glass substrate 810 including lens 602b can be stacked on top of glass substrates 806 and 802, with lenses 602a and 602b aligned along the same optical axis 612. Image sensor 604 can be soldered onto PCB 720 via solder balls 724 to form conductive bonds.

Compared with image sensor module 700 of FIG. 7, image sensor module 800 can provide a reduced footprint. Specifically, as shown in FIG. 8A, the footprint of glass substrates 802, 806, and 810 can be substantially the same or smaller than image sensor 604, unlike image sensor module 700 where shoulder structure 706 extends outwards from image sensor 604. As a result, the footprint of image sensor module 800 (represented by $L_{800}$) can be substantially the same as the footprint of image sensor 604 (represented by $L_{604}$).

The glass substrates in image sensor module 700 can also provide a certain degree of alignment between lens 602 and image sensor 604, such as defining the vertical distance (labelled "d" in FIG. 8A) between the lens and the image sensor die. However, the degree of alignment can be limited by the fabrication of image sensor module 700 which is typically based on a wafer-level optics process.

FIG. 8B illustrates an example of a wafer-level optics process. As shown in FIG. 8B, multiple lenses 602a can be formed on a glass wafer 822. Moreover, multiple cavities 808 can be formed on a glass wafer 824, whereas multiple lenses 602b can be formed on a glass wafer 826. Glass wafers 822, 824, and 826 can be stacked, and each glass wafer can be moved along the x and y axes to align each lens 602a, cavity 808, and lens 602b along the same optical axis 612 as shown in FIG. 8A. An alignment process can be performed to align glass wafers 822, 824, and 826. Specifically, images of alignment marks 832, 834, and 836 on, respectively, glass wafers 822, 824, and 826 can be captured by cameras 840 and 842, and a degree of alignment among the wafers can be determined based on the images. Each wafer can be moved against each other until the images of alignment marks 832, 834, and 836 indicate that a target degree of alignment is reached. After the glass wafers are stacked and aligned, the glass wafer stack can then be stacked on a semiconductor wafer 850 including multiple image sensor dies 852, with each die corresponding to image sensor 604. The glass wafer stack can also be moved along the x and y axes to align the lens with the image sensor dies 604. The alignment of the glass wafer stack with respect to semiconductor wafer 850 can also be based on images of alignment marks 832/834/836 of the glass wafer stack and alignment mark 854 on semiconductor wafer 850 captured by cameras 840 and 842. After the alignment process completes, the glass wafer stack and the image sensor dies can be diced to form individual image sensor module 800.

The alignment process in FIG. 8B can only provide a limited degree of alignment between lens 602 and image sensor 604. This is because the alignment is on a wafer-level and cannot completely eliminate the location/orientation differences of lens 602 between different image sensor modules. FIG. 8C illustrates an example of the limited alignment. As shown in FIG. 8C, two lens 602a1 and 602a2 are separated by a horizontal distance d1 and a vertical distance Δz on glass wafer 822, whereas two image sensor dies 852a and 852b are separated by a horizontal distance d2 on semiconductor wafer 850. Based on alignment between glass wafer 822 and semiconductor wafer 850, each of lenses 602a1 and 602a2 may misalign with, respectively, image sensor dies 852a and 852b by half of the difference between d1 and d2. Moreover, as wafer 826 is only moved along the x/y axes to align with semiconductor wafer 850, the misalignment along the vertical axis, caused by Δz, may remain for image sensor die 852b. Moreover, there is also no rotation of wafer 626 (or image sensor 604) around the x, y, and z axes to correct the alignment.

In some examples, the alignment between the stack of glass substrates 802, 806, and 810 and image sensor 604 in the wafer-level optics process can be performed after the glass substrates stack are diced to form a lens stack (including diced glass substrates 802, 806, and 810 as well as lenses 602a and 602b) for each image sensor 604. The lens stack can be moved with respect to an image sensor 604 and along the x/y axes based on, for example, alignment between edges of the lens stack and features of image sensor 604. However, there is also no rotation of wafer 626 (or image sensor 604) around the x, y, and z axes to correct the alignment. Therefore, only a limited degree of alignment between lens 602 and image sensor 604 can be achieved.

Figure 9A:
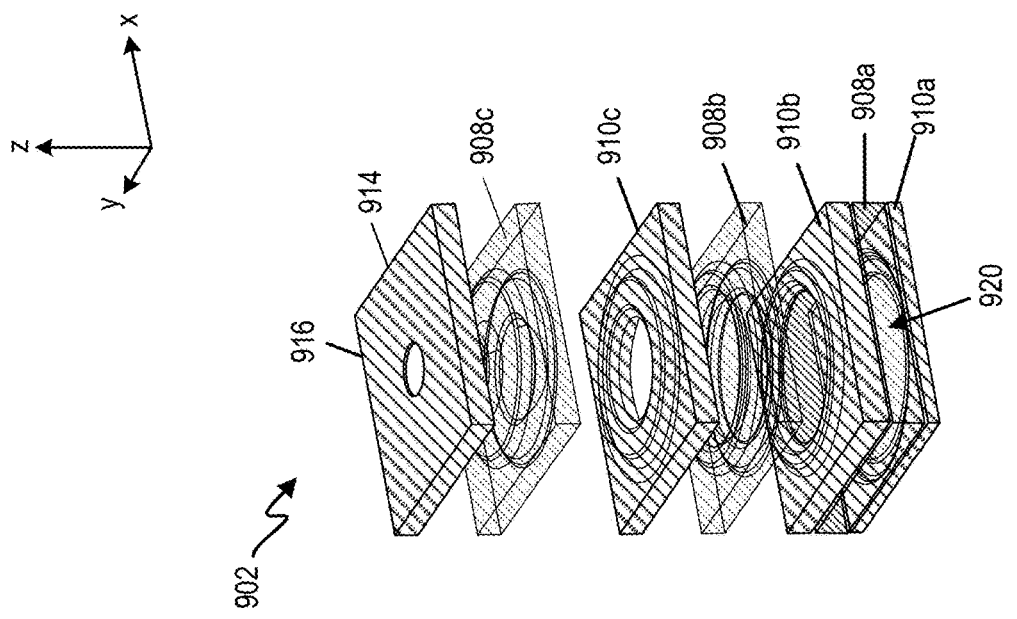
FIG. 9A, FIG. 9B, and FIG. 9C illustrate other examples of an image sensor module.
Figure 9A:
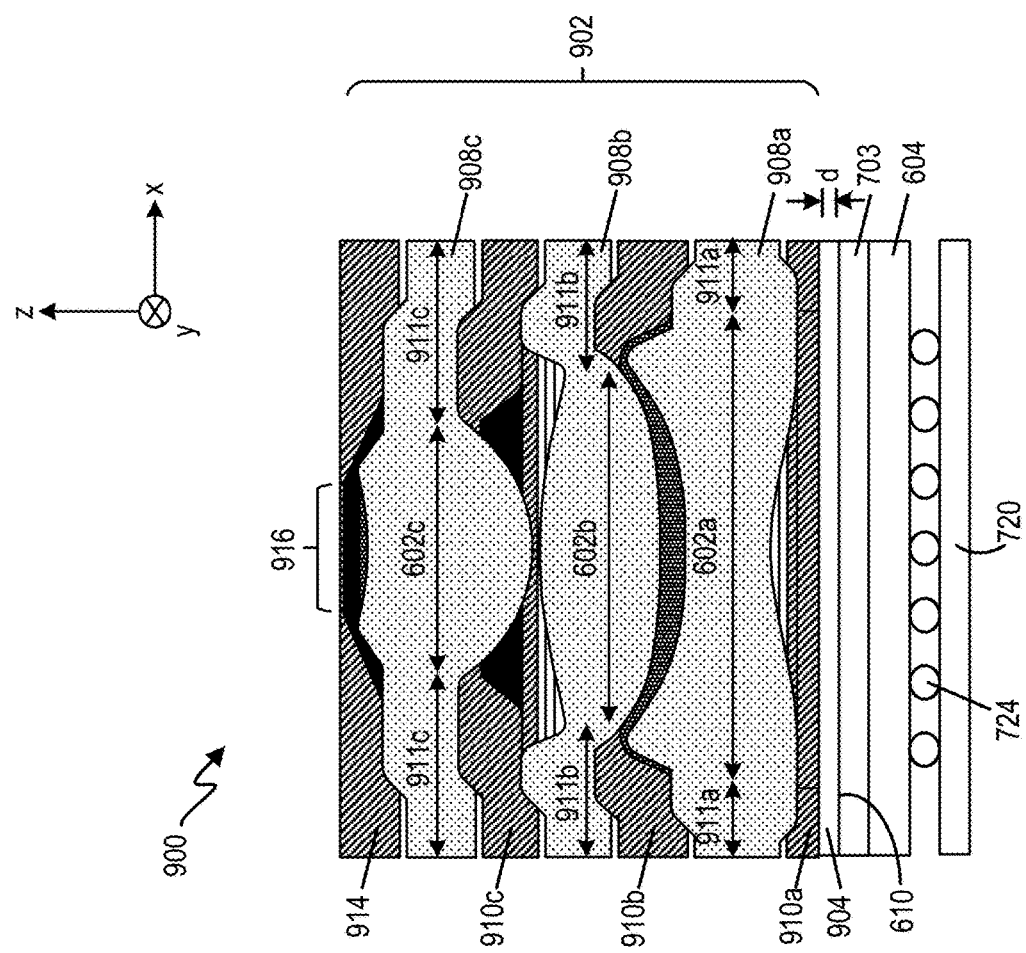
Figure 9B:
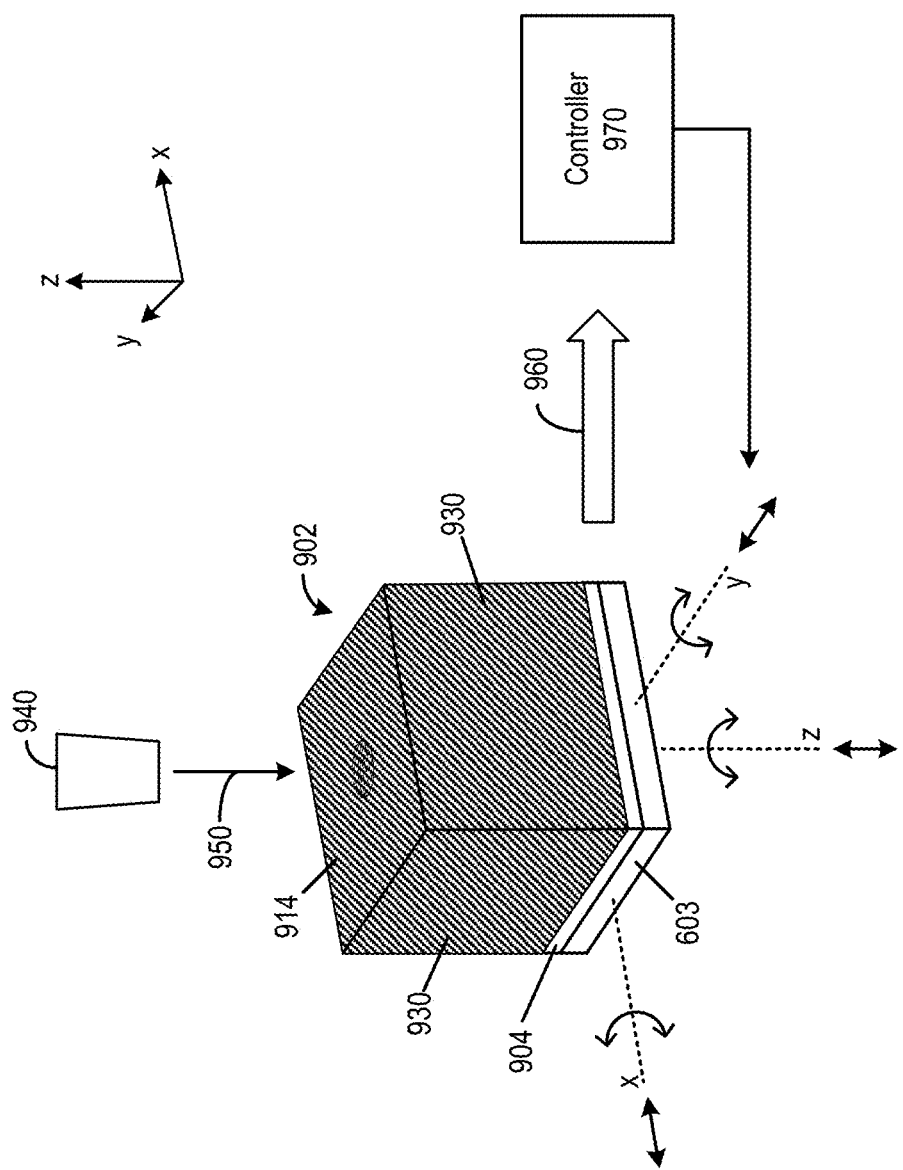
Figure 9C:
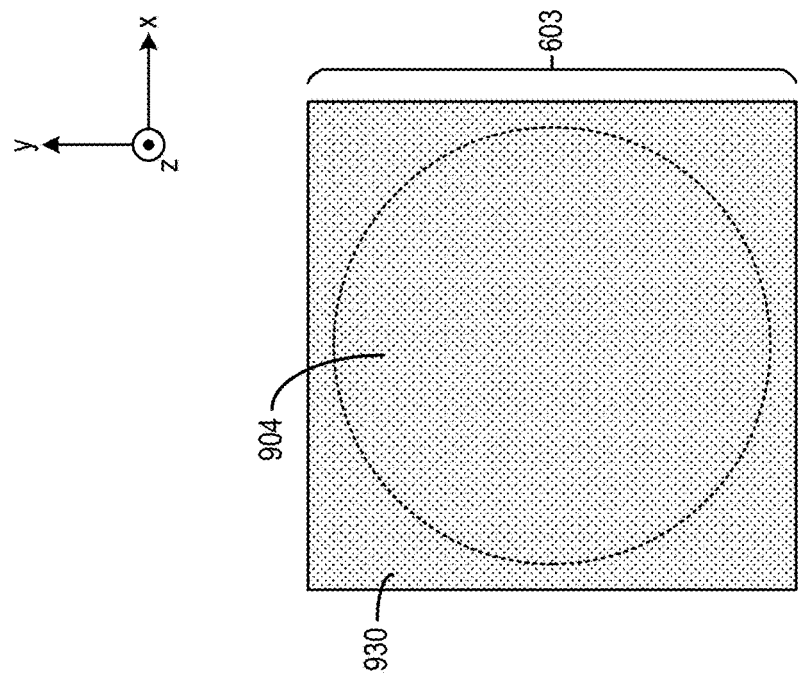
Figure 9C:
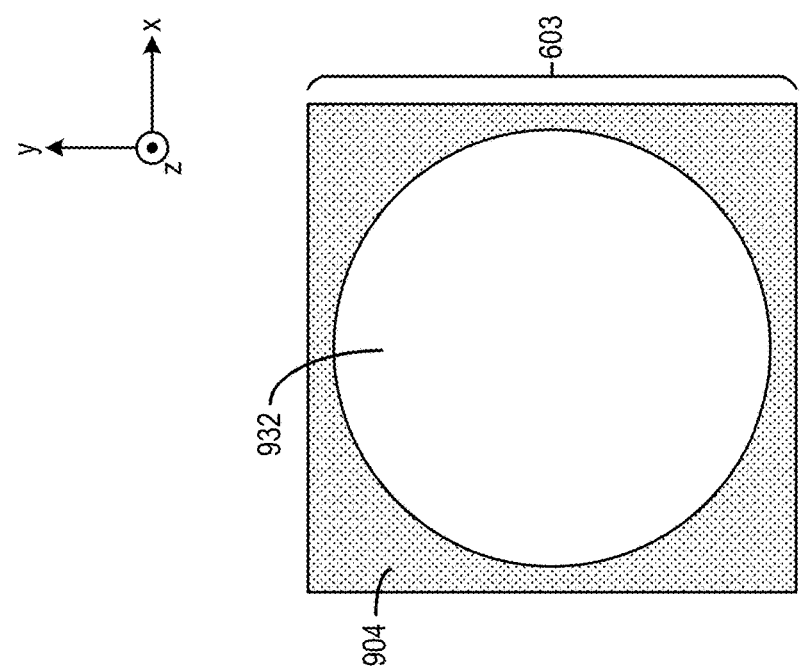

FIG. 9A-FIG. 9C illustrate examples of an image sensor module that can provide both reduced footprint and improved optical properties. As shown in FIG. 9A, an image sensor module 900 can include a lens assembly 902 and image sensor 604 of FIG. 7. Image sensor 604 can be positioned below lens assembly 902 and can be bonded to lens assembly 902 via a bonding layer 904. As lens assembly 902 does not include any shoulder structures that are adjacent to the sides of image sensor 604, lens assembly 902 does not add to the footprint of image sensor module 900. The footprint of image sensor module 900 is mostly contributed by image sensor 604.

Lens assembly 902 can include one or more layers 908 and one or more spacers 910, with each layer having a lens portion formed as lens 602 and an extension portion 911. The lens portion is configured to gather and direct light towards image sensor 604, whereas extension portion 911 can provide mechanical support for the lens portion. For example, extension portion 911 can rest on or be supported by spacer 910, which includes an opening to fit the lens portion of layer 908. Each layer can be made of, for example, a polymer material such as a cyclic olefin copolymer (COC) material which can provide a lower Abbe number and reduced birefringence, both of which can reduce light dispersion by lens 602. Other polymer materials that can be used to fabricate layers 908 may include, for example, APEL5014CL, OKP1, OKP4, EP8000. APEL5014CL can be a COC. OKP1 and OKP4 can be a polyester, whereas EP8000 can be a polycarbonate. Each layer can also be made of other materials such as, for example, glass. Spacers 910 can also be made of an opaque material such as, for example, an opaque polymer, metal, etc.

In a case where lens assembly 902 includes multiple lenses 602 (e.g., three lenses 602a, 602b, and 602c as shown in FIG. 9A), each layer 908 (e.g., layers 908a, 908b, and 908c) can stack on top of each other and bonded to a spacer 910, which can provide mechanical support and define the location and orientation of lens 602 within lens assembly 902. For example, extension portion 911a of layer 908a can be bonded to spacer 910a, which includes an opening 920 for outputting light to image sensor 604. In some examples, opening 920 can be filled with part of lens 602a to form a light outputting surface. Moreover, spacer 910b can be inserted between layers 908b and 908a with extension portion 911b of layer 908b bonded to spacer 910b, whereas spacer 910c can be inserted between layers 908c and 908b with extension portion 911c of layer 908c bonded to spacer 910c. Lens assembly 902 further includes a top cover 914 which includes an aperture 916 for receiving incident light.

In some examples, an opaque/dark coating layer 930 (shown in FIG. 9B) can be applied on the external vertical surfaces of lens assembly 902 to prevent light from entering through the side of lens assembly 902 to ensure that light only enters through aperture 916. In some examples, as shown in FIG. 11B, In some examples, some of the spacers 910 between layers 908 can be omitted in lens assembly 902. The extension portion 911 and/or lens 602 of two layers 908 can be bonded to form a stack. For example, extension 911c of layer 908c and extension 911b of layer 908b can be bonded together, whereas extension 911b of layer 908b and extension 911a of layer 908a can also be bonded together, to form lens assembly 902. As another example, lenses 602c and 602b can be bonded together, whereas 602b and 602c can also be bonded together, to form lens assembly 902.

Layers 908a, 908b, and 908c can be fabricated by high precision processes, such as injection molding, to provide improved control over the physical dimensions (e.g., curvatures) of lenses 602a, 602b, and 602c and the resulting optical properties of lens assembly 902. Moreover, spacers 910a, 910b, and 910c, as well as top cover 914, can also be fabricated by injection molding to provide tighter fit between the layers, the spacers, and the covers, which can improve the rigidity of lens assembly 902. In some examples, spacers 910a, 910b, and 910c, as well as top cover 914 can be made of stamped or machined metal.

Image sensor 604, which can include glass substrate 703 (shown as a separate component in the figures), can be bonded to lens assembly 902 via a bonding layer 904. Bonding layer 904 can be formed by applying a layer of adhesive material onto image sensor 604 after image sensor 604 is soldered onto PCB 720 via solder balls 724 in a reflow process. Image sensor 604 (soldered onto PCB 720) and lens assembly 902 can then be brought together so that spacer 910a comes into contact with the adhesive material. The adhesive material can then be hardened in a curing process to form bonding layer 904, which can provide permanent bonding between image sensor 604 and lens assembly 902.

Bonding layer 904 can be used to maintain the alignment between image sensor 604 with lens 602 of lens assembly 902 obtained from an alignment process prior to the curing process, when the adhesive material remains in a liquid state. FIG. 9B illustrates an example of the alignment process, in which the position and orientation of image sensor 604 with respect to lens assembly 902 can be adjusted based on sensor data generated by image sensor 604 which reflects a degree of alignment. Referring to FIG. 9B, image sensor 604 can be enabled (powered on) to sense light that passes through lens assembly 902 during the alignment process. In one example, lens assembly 902 can be held at a fixed location and a fixed orientation, whereas image sensor 604 (and PCB 720) can be supported on a platform (not shown in FIG. 9B) that can support six degrees of movements including linear movements along each of the x, y, and z axes, as well as rotations about each of the x, y, and z axes. In another example, image sensor 604 (and PCB 720) can be held at a fixed location and a fixed orientation, whereas lens assembly 902 can be moved/rotated. A light projector 940 can project a light pattern 950 (e.g., a two-dimensional light pattern of an image) to lens assembly 902, which can direct light pattern 950 towards image sensor 604, which can generate sensor data 960 of the image based on the sensing of light pattern 950. As described above, a degree of alignment between image sensor 604 and lens 602 (e.g., how far image sensor 604 is from the focal point of lens 602, or the orientation and position of image sensor 604 with respect to optical axis 612 of lens 602) can determine a quality of image generated by image sensor 604 from the sensing of light pattern 950. A controller 970 can analyze sensor data 960 to determine, for example, a degree of blurriness, a degree of distortion, etc., of the image represented by sensor data 960, from which controller 970 can determine a degree of alignment between image sensor 604 and lens 602. Based on the degree of alignment, controller 970 can control a movement of lens assembly 902 and/or image sensor 604 (e.g., based on linear movements along each of the x, y, and z axes, rotations about each of the x, y, and z axes, etc.) to align image sensor 604 with respect to lens assembly 902 when the adhesive between image sensor 604 and lens assembly 902 remains in the liquid state. The adhesive can be squeezed or stretched to allow the movement.

Controller 970 can continue moving at least one of image sensor 604 or lens assembly 902 to adjust the alignment until a target degree of alignment is reached. For example, a target degree of alignment is reached when optical axis 612 (not shown in FIG. 9A) of one or more lenses 602 aligns with the center of the image sensor 604, light receiving surface 610 is perpendicular to the optical axis 612 and is separated from one or more lenses 602 by a pre-determined distance, etc. When the target degree of alignment is reached, the adhesive can be hardened in a curing process. The curing process can be based on, for example, ultraviolet light, a thermal process at a temperature lower than the melting point of the polymer lens (to avoid deforming the lens), or both. When the adhesive is hardened, bonding layer 904 can be formed to bond image sensor 604 with lens assembly 902 while maintaining image sensor 604 at the aligned position and orientation with respect to lens assembly 902. As image sensor 604 can be moved with respect to lens assembly 902 based on linear movements along each of the x, y, and z axes, rotations about each of the x, y, and z axes, and based on sensor data generated by image sensor 604 which can provide an accurate account of the instantaneous degree of alignment, the achievable degree of achievable alignment between lens 602 and image sensor 604 can be substantially increased.

There are various ways of distributing the adhesive to form bonding layer 904. In one example, as shown in the left diagram of FIG. 9C, bonding layer 904 can be formed around a perimeter of image sensor 604 surrounding a region 932. Region 932 can be over light receiving surface 610 of image sensor 604 and faces opening 920 of spacer 910a of lens assembly 902. With such arrangements, adhesives that become opaque or otherwise have a low light transmittance upon becoming hardened can be used to form bonding layer 904 without blocking the light from reaching image sensor 604, but the application of the adhesive is restricted such that the adhesives do not spill into region 932 when squeezed during the alignment process. In another example, as shown in the right diagram of FIG. 9C, bonding layer 904 can be formed over region 932 to bond with, for example, the part of lens 602a that fills opening 920. With such arrangements, there can be fewer restrictions on the application of the adhesive on image sensor 604, but the adhesive needs to be transparent or at least have a high light transmittance upon becoming hardened by the curing process. In some examples, the adhesive can also be formed on lens assembly 902 (e.g., on a surface of spacer 910a facing image sensor 604) to bond with image sensor 604.

Figure 10:
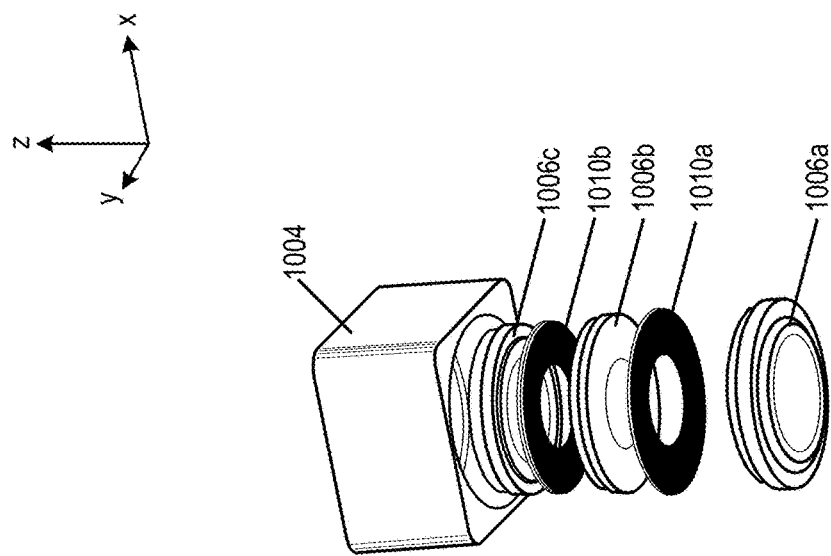
FIG. 10 illustrates another example of an image sensor module.
Figure 10:
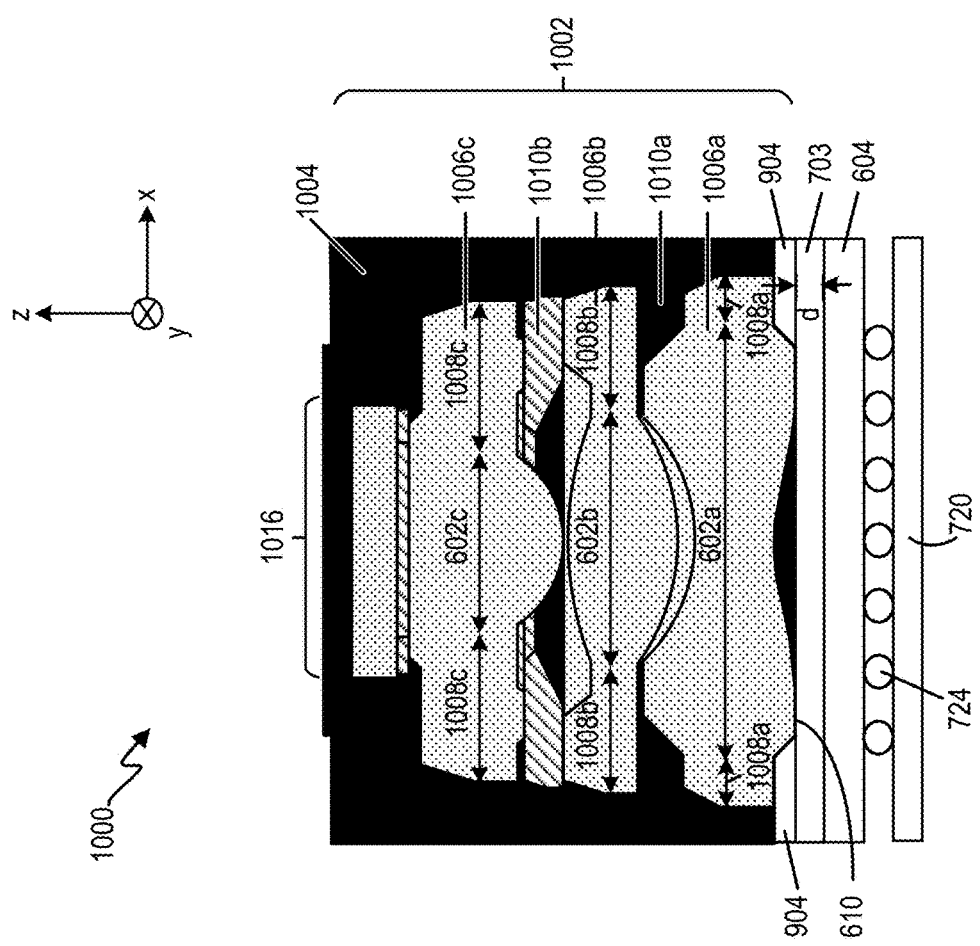

FIG. 10 illustrates another example of an image sensor module that can provide both reduced footprint and improved optical properties. As shown in FIG. 10, an image sensor module 1000 can include a lens assembly 1002 and image sensor 604 of FIG. 7. Lens assembly 1002 can include an opaque/dark lens housing 1004, which can be in the form of a barrel, that holds one or more lenses 602. Housing 1004 can be made of, for example, a polymer material, a metal, etc. Image sensor 604 can be positioned below housing 1004 and can be bonded to lens assembly 1002 via bonding layer 904. As lens assembly 1002 does not include any shoulder structure that are adjacent to the sides of image sensor 604, lens assembly 1002 does not add to the footprint of image sensor module 1000. The footprint of image sensor module 1000 is mostly contributed by image sensor 604.

In some examples, as shown in FIG. 10, each of one or more lenses 602 can be part of a layer 1006 including an extension portion 1008. Lens assembly 1002 may also include one or more spacers 1010. The lens portion of layer 1006 is configured to gather and direct light towards image sensor 604, whereas the extension portion 1008 can provide mechanical support to the lens portion. For example, extension portion 1008 can rest on or be supported by spacer 1010, which includes an opening to fit the lens portion of layer 1006. Each layer 1006 and spacer 1010 are mechanically coupled (e.g., via adhesive) to the inner wall of housing 1004. Each layer 1006 can be made of the same material as layer 908 including, for example, a polymer material (e.g., COC, polycarbonate), a glass material, etc. Spacers 1010 can also be made of an opaque material such as polymer and metal. In a case where lens assembly 902 includes multiple lenses 602 (e.g., three lenses 602a, 602b, and 602c as shown in FIG. 10), each layer 1006 (e.g., layers 1006a, 1006b, and 1006c) can stack on top of each other and separated by a spacer 1010, which can provide mechanical support and define the location and orientation of lens 602 within lens assembly 1002. For example, extension portion 1008a of layer 1006a and extension portion 1008b of layer 1006b can be separated by spacer 1010a, whereas extension portion 1008b of layer 1006b and extension portion 1008c of layer 1006c can be separated by spacer 1010b. Housing 1004 further includes an aperture 1016 for receiving incident light.

Similar to image sensor module 900, each layer 1006 can be fabricated by high precision processes, such as injection molding, to provide improved control over the physical dimensions (e.g., curvatures) of lenses 602a, 602b, and 602c and the resulting optical properties of lens assembly 1002. Moreover, spacers 1010 can also be fabricated by injection molding, machined/stamped metals, etc., to provide tighter fit between the layers and the spacers to improve the rigidity of lens assembly 1002. Moreover, bonding layer 904 can be used to maintain the alignment between image sensor 604 (of image sensor 604) with lens 602 of lens assembly 1002 obtained from an alignment process as described in FIG. 9B.

In some examples, the optical elements of an image sensor module, such as image sensor modules 700, 800, 900, and 1000 of FIG. 7-FIG. 10, may include a filter. The filter can include a filter array to select different frequency components of the light to be detected by different pixel cells the image sensor, or a single frequency component of the light to be detected by all pixel cells. The image sensor includes light sensing elements (e.g., photodiodes) that can receive the different frequency components of the light selected by the filter array via the light receiving surface and convert the frequency components to electrical signals. The electrical signals can represent, for example, intensities of the different frequency components of light from a scene.

Figure 11A:
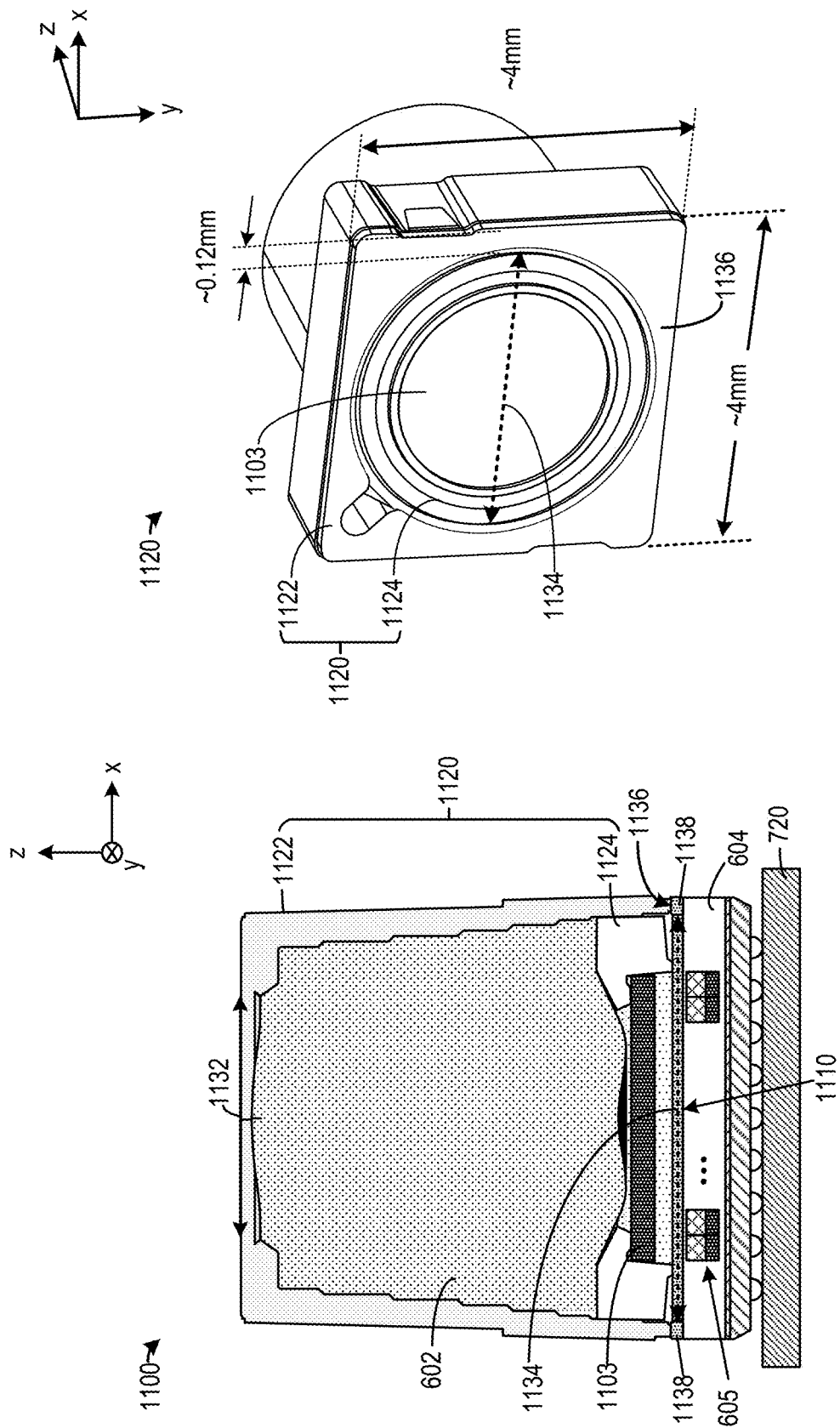
FIG. 11A, FIG. 11B, and FIG. 11C illustrate other examples of an image sensor module.
Figure 11B:
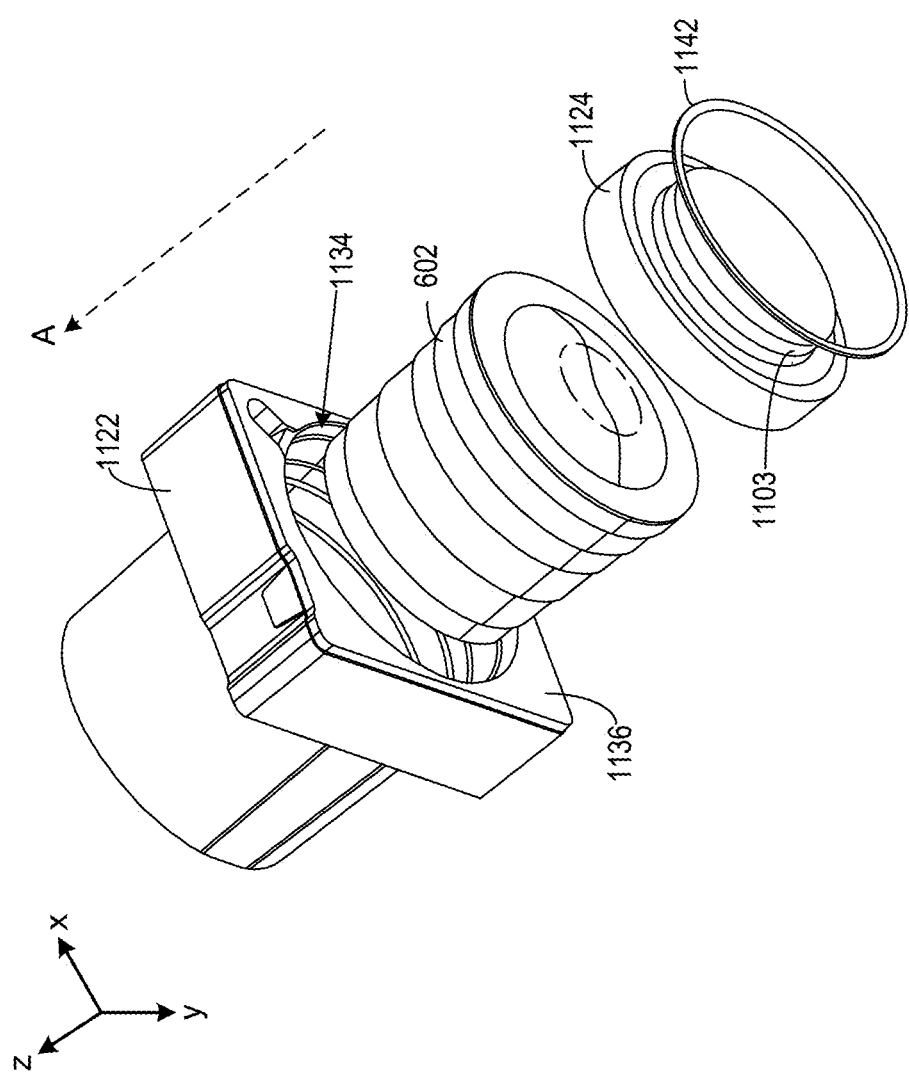
Figure 11C:
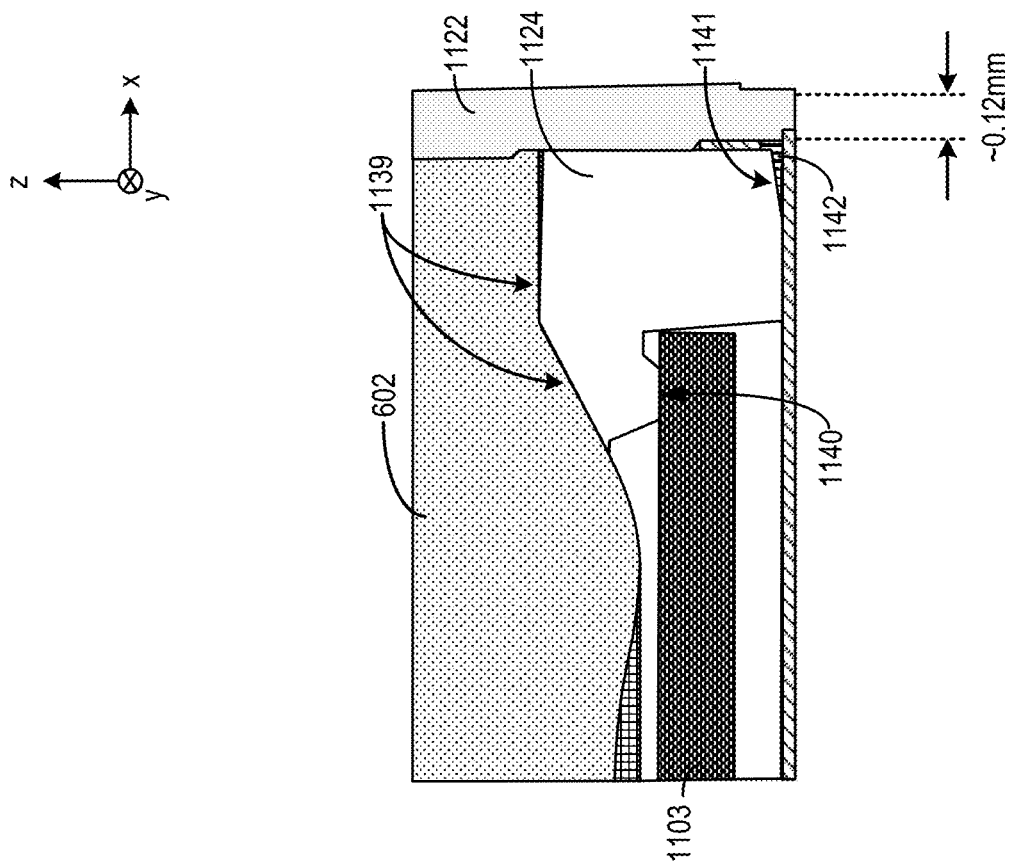
Figure 11C:
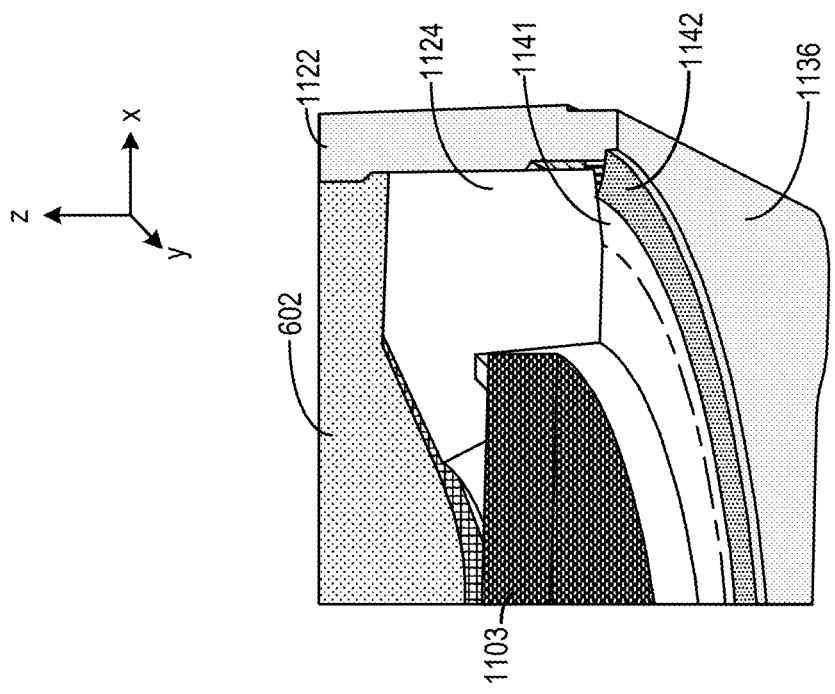

FIG. 11A, FIG. 11B, and FIG. 11C illustrate examples of an image sensor module 1100 including a filter. Image sensor module 1100 can be part of image sensor modules 120a-120d and 150a-150b of FIG. 1A, FIG. 1B, and FIG. 1C, and part of image sensor module 370 of FIG. 3. Image sensor module 1100 may include components of image sensor modules 700, 800, 900, and 1000 of FIG. 7-FIG. 10, such as one or more lenses 602 and image sensor 604. As shown on the left of FIG. 11A, which represents an internal side view of image sensor module 1100, image sensor module 1100 includes one or more lenses 602, a filter 1103, and image sensor 604 including an array of pixel cells 605 as shown in FIG. 6A. One or more lenses 602 (shown as an unified body in FIG. 11A for simplicity) can include a single lens or multiple lens separated by spacers and aligned in a stack along a propagation direction of light (e.g., along the z-axis) to pass the light, as shown in FIG. 7-FIG. 10. In some examples, the light can be focused and can converge at a focal point. The light can be filtered by filter 1103, which can select one or more frequency components of the light to be detected by image sensor 604. In some examples, filter 1103 can select a single frequency range (e.g., a visible frequency range, an infrared frequency range, etc.) of light to be detected by image sensor 604. In some examples, filter 1103 can include a filter array to select different frequency ranges (e.g., a red frequency range, a blue frequency range, a green frequency range, an infrared frequency range) of light to be detected by image sensor 604.

Array of pixel cells 605 below light receiving surface 610 of image sensor 604 can convert different frequency components of the light to electrical signals. The electrical signals can represent, for example, intensities of the different frequency components of light from a scene. Based on the electrical signals, an image processor can generate an image of the scene. The image sensor module can be soldered onto a printed circuit board (PCB) 720 which also includes an image processor (not shown in the figures). PCB 720, as described in FIG. 7, includes electrical traces to transmit the electrical signals from the image sensor module to the image processor, which can generate an image of the scene based on the electrical signals.

Image sensor module 1100 includes a holder structure 1120 to hold and physically support one or more lenses 602 and filter 1103. Specifically, as shown in FIG. 11A, holder structure 1120 may include a housing 1122, which can be include housing 1004 of FIG. 10, and a retainer 1124. Both housing 1122 and retainer 1124 can be made of, for example, a polycarbonate (PC) material, and/or a polymer material (e.g., liquid crystal polymer, LCP) using injection molding. Housing 1122, which can be in the form of a barrel, includes a top opening 1132 to receive light and a bottom opening 1134 to output light to image sensor 1104. Referring to FIG. 11B, one or more lenses 602 can be loaded into housing 1122 through bottom opening 1134 towards top opening 1132 (indicated by direction labelled "A"). One or more lenses 602 can be mounted at pre-determined positions within housing 1122 between top opening 1132 and bottom opening 1134 to form a lenses stack, where housing 1122 can provide physical support to the lenses stack. In addition, housing 1122 is stacked on image sensor 604 along the z-axis.

Referring back to FIG. 11A, bottom surface 1136 of housing 1122, which surrounds bottom opening 1134, can be bonded to light receiving surface 1110 of image sensor 604 via, for example, an adhesive 1138 followed by UV curing to harden the adhesive, similar to the formation of bonding layer 804/904 in FIG. 8A-FIG. 10. Based on the bonding with image sensor 604, housing 1122 can set the orientation and position of one or more lenses 602 with respect to image sensor 604. In some examples, bottom surface 1136 is bonded to the image sensor die of image sensor 1104. In some examples, bottom surface 1136 is bonded to other components of image sensor 604, such as glass substrate 703 (not shown in FIG. 11A), a package of image sensor 604, etc.

In addition, retainer 1124 can be mounted within housing 1122 between the lenses stack and bottom opening 1134. Referring to FIG. 11C, retainer 1124 can include an upper surface 1139 (highlighted with a dotted line) to support one or more lenses 602 to prevent the lenses from falling out of bottom opening 1134, and a middle surface 1140 (highlighted with a dotted line) to mount filter 1103 (e.g., via a layer of adhesive not shown in the figures). Retainer 1124 is positioned away from bottom opening 1134 and further includes a recessed bottom surface 1141 to prevent retainer 1124 from protruding out of housing, when accounting for tolerance in the placement of retainer 1124 within housing 1122. Such arrangements can ensure that bottom surface 1136 of housing 1122 is in contact with image sensor 604 when holder structure 1120 is placed on image sensor 604, while no part of retainer 1124 is in contact with image sensor 604. To maintain the position of retainer 624 within housing 1122, an adhesive 1142 can be applied on recessed bottom surface 641 of retainer 1124 and inner wall of housing 1122, followed by UV curing, to bond housing 1122 with retainer 1124.

Although FIG. 11A illustrates that housing 1122 includes a cylindrical portion and a rectangular/square portion, and that bottom opening 1134 has a circular shape, it is understood that housing 1122 and bottom opening 1134 can have other geometric shapes. For example, housing 1122 can include only a cylindrical barrel, a rectangular/square barrel, etc., whereas the bottom opening can have a rectangular/square shape.

The arrangements of FIG. 11A-FIG. 11C, in which housing 1122 is attached on image sensor 604 to form a stack, can reduce the footprint of the image sensor module 1100 on PCB 720. The reduced footprint can be desirable especially for integrating image sensor module 600 in a mobile device, such as near-eye display 100, where space is very limited. For example, referring back to FIG. 1C, in order to fit image sensor module 1100 into frame 105, a width of image sensor module 1100 needs to be made shorter than the thickness (t) of frame 105. Moreover, a length of image sensor 600 (e.g., of sensor 120a) also needs to be reduced so that pixel cells 605 of image sensor 604 can be positioned close to illuminator 130, to improve the imaging operation (e.g., 3D sensing, stereoscopic imaging) involving illuminator 130 and sensor 120. By shrinking the footprint of image sensor module 1100, it becomes more likely to fit image sensor module 1100 into near-eye display 100.

Although the arrangements in FIG. 11A-FIG. 11C, in which holder structure 1120 forms a stack with image sensor 604, can shrink the footprint of image sensor module 1100 in a similar way as shown in FIG. 8A-FIG. 10, the mounting of the retainer 1124 within housing 1122 can create various issues. Those issues can affect the assembly of the image sensor module as well as the optical properties and performance of the image sensor module. Specifically, as described above, housing 1122 is bonded to image sensor 604 only via bottom surface 1136, while retainer 1124 is not in contact with image sensor 604. But bottom surface 1136 of housing 1122 provides a very limited area for applying adhesive 638, which makes the bonding of housing 1122 to image sensor 604 difficult. Moreover, bottom opening 1134 may be enlarged to allow more pixel cells 605 of image sensor 604 to receive light, which can improve imaging resolution. But given that housing 1122 surrounds the lens and retainer 1124, which increases the footprint, the thickness of housing 1122 needs to be reduced to reduce the footprint. But reducing the thickness of housing 1122 reduces bottom surface 1136 of housing 1122 as well as the available area for applying adhesive 1138. In one example, as shown in FIG. 11A and FIG. 11C, where the x/y dimension of image sensor 604 is around 4 millimeter (mm), a minimum width of bottom surface 1136 of housing 1122 can be shrunk to about 0.12 mm. The reduced bonding area can lead to a weaker bonding between housing 1122 and image sensor 604. The weak bonding may allow housing 1122 to shift with respect to image sensor 604, which changes the orientations and alignment of the lenses stack with respect to image sensor 604 and degrades the light sensing performance of image sensor module 1100.

Moreover, due to the reduced bonding area, the amount of adhesive 1138 applied, as well as the locations on bottom surface 636 where adhesive 1138 is applied, need to be controlled with a very high precision. This is to prevent the adhesive applied to bottom surface 1136 of housing 1122 from spilling into bottom opening 1134 when housing 1122 and image sensor 604 are brought together. But the requisite precision may become unachievable as the area of bottom surface 1136 shrinks to reduce the footprint of image sensor module 1100. For example, it becomes very difficult to control the application of adhesive 1138 in an 0.12 mm region of bottom surface 1136 due to limits imposed by, for example, the diameter of a nozzle that applies the adhesive. The adhesive spilled into bottom opening 1134 can obfuscate filter 1103 and/or the pixel cells 605 of image sensor 604. All these can degrade the light sensing performance of the image sensor module.

Figure 12A:
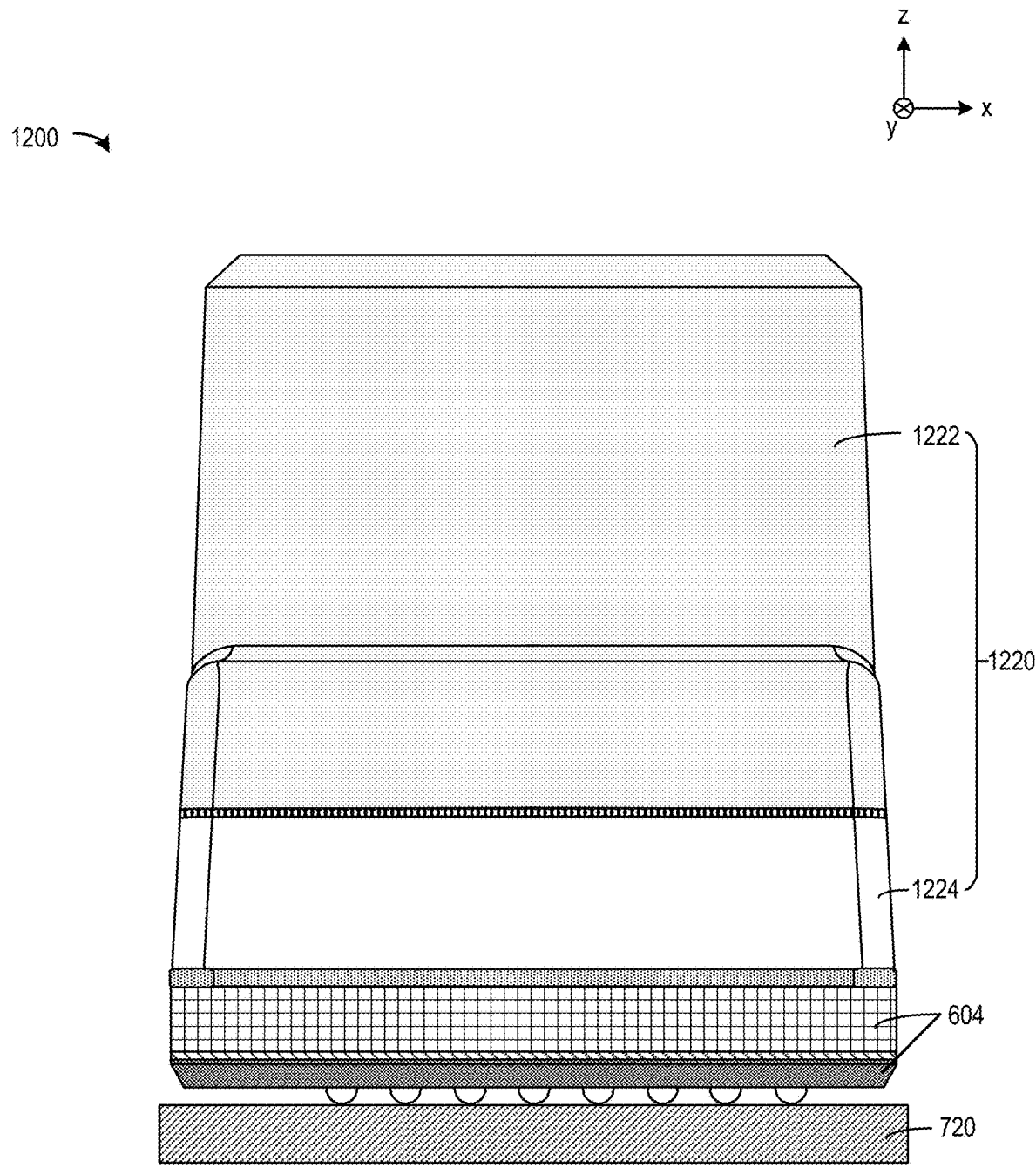
FIG. 12A, FIG. 12B, and FIG. 12C illustrate other examples of an image sensor module.
Figure 12B:
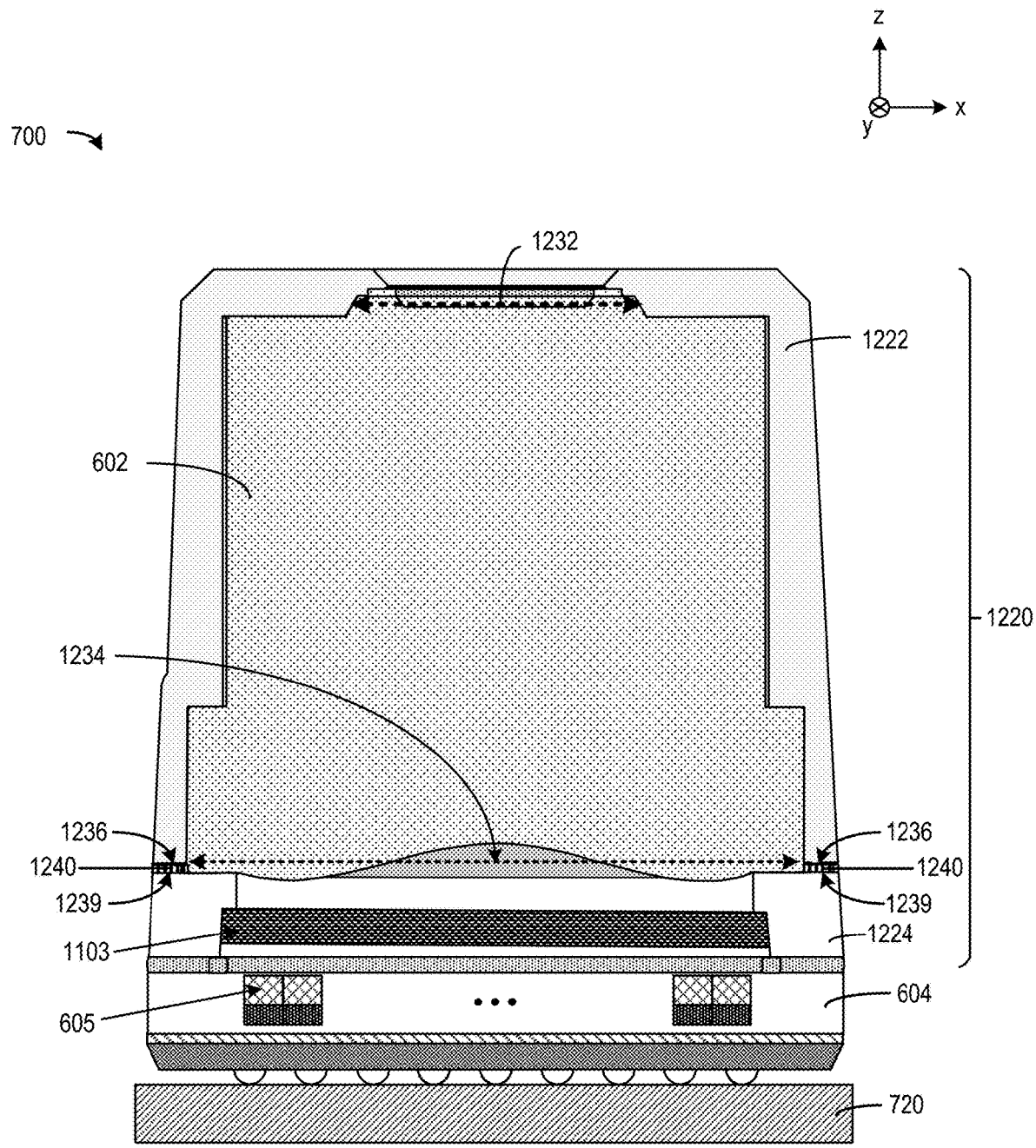
Figure 12C:
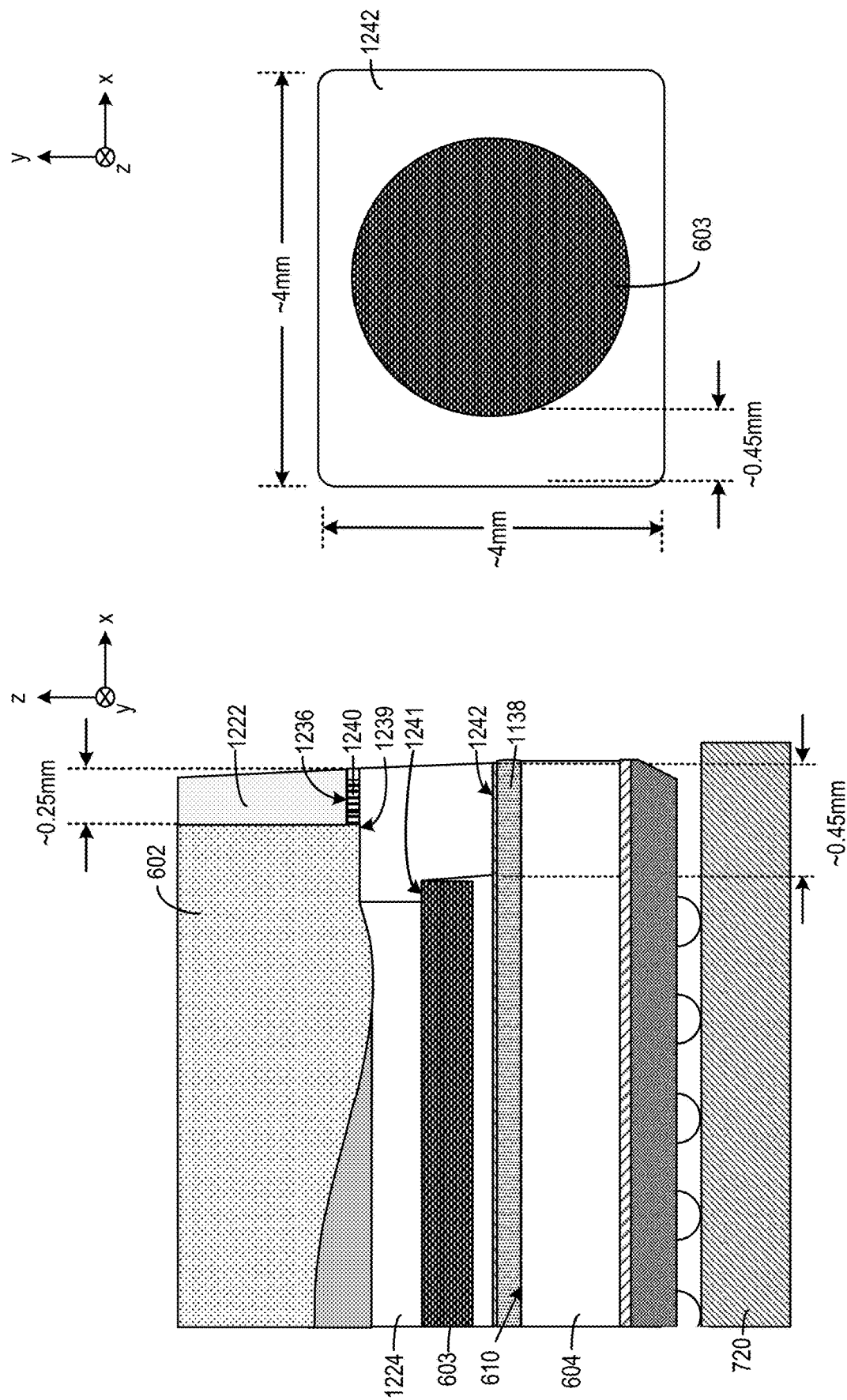

FIG. 12A, FIG. 12B, and FIG. 12C illustrate examples of an image sensor module 700 that can address at least some of the issues above. FIG. 12A illustrates an external side view of image sensor module 1200, whereas FIG. 12B illustrates an internal side view of image sensor module 1200. As shown in FIG. 12A and FIG. 12B, image sensor module 700 includes a holder structure 1120 to hold and physically support one more lenses 602 and filter 1103. Holder structure 1220 can be mounted on image sensor 604, which in turn is mounted on PCB 720. Holder structure 1220 includes a housing 1222 and a retainer 1224. Housing 1222 can be in the form of a barrel in which one or more lenses 602 are mounted to form a lenses stack, whereas filter 1103 can be mounted on retainer 1224, as in image sensor module 1100 of FIG. 11A-FIG. 11C. However, unlike in image sensor module 1100 in which retainer 1124 is mounted within housing 1122 in image sensor module 1200, at least a part of retainer 1224 is sandwiched between housing 1222 and image sensor 604, such that housing 1222, retainer 1224, and image sensor 604 form a stack (e.g., along the z-axis). In addition, retainer 1224 is bonded with image sensor 604 via an adhesive to set the orientation and position of one or more lenses 602 with respect to image sensor 604.

Referring to FIG. 12B, housing 1222, which can be in the form of a barrel, includes a top opening 1232 to receive light and a bottom opening 1234 to output light to image sensor 604. As in image sensor module 1100, one or more lenses 602 can be loaded into housing 1222 of image sensor module 1200 through bottom opening 1234 towards top opening 1232. One or more lenses 602 can be mounted at predetermined positions within housing 1222 between top opening 1232 and bottom opening 1234 to form a lenses stack, with housing 1222 to provide physical support to the lenses stack. Housing 1222 further includes a bottom surface 1236 which surrounds bottom opening 1234 and can be bonded with a top surface 1239 of retainer 1224 via an adhesive layer 740.

FIG. 12C illustrates a magnified internal side view (left diagram) and a bottom view (right diagram) of retainer 1224. As shown in FIG. 12C, retainer 1224 includes, in addition to top surface 1239, a middle surface 1241 and a bottom surface 1242. An outer portion of top surface 1239 of retainer 1224 is bonded to bottom surface 1236 of housing 1222 via an adhesive 1240, whereas an inner portion of top surface 1239 supports one or more lenses 602 to prevent the lenses from falling out of bottom opening 1234 of housing 1222. Moreover, middle surface 1241 provides a surface to mount filter 1103. In addition, bottom surface 742 of retainer 1224 is flat and is bonded with light receiving surface 610 of image sensor 604 via an adhesive 1138. Both adhesives 1138 and 1240 can be cured by, for example, UV light to form a bonding layer.

Compared with bottom surface 1136 of housing 1122 of FIG. 11A, the width of bottom surface 1242 of retainer 1224, as well as the width of bottom surface 1236 of housing 1222, can be enlarged to increase the bonding area between retainer 1224 and image sensor 604. In addition, the footprint of image sensor module 1200 imposes less restriction on the width of bottom surface 1242 of retainer 1224. Specifically, referring back to FIG. 11A, bottom surface 1136 of housing 1122 surrounds both retainer 1124 and filter 1103. As a result, bottom surface 1136 needs to be made narrower to accommodate the width of retainer 1124 and filter 1103 for a given footprint. In contrast, in FIG. 12A-FIG. 12C, bottom surface 1242 of retainer 1224 may surround filter 1103 only, whereas bottom surface 1236 of housing 1222 only surrounds one or more lenses 602. Therefore, even for the same footprint and with the same filter 1103, bottom surface 1242 of retainer 1224 of FIG. 12A-FIG. 12C can be made wider and provide a larger bonding area between retainer 1224 and image sensor 604, compared with bottom surface 1136 of housing 1122 of FIG. 11A-FIG. 11C. Moreover, bottom surface 1236 of housing 1222 can also be made wider and provide a larger bonding area between housing 1222 and retainer 1224, compared with the bonding area between housing 1122 and retainer 1124 of FIG. 11A-FIG. 11C.

In one example, as shown in FIG. 11C, with a footprint of 4 mm×4 mm (e.g., same as image sensor module 600), the minimum width of bottom surface 1242 of retainer 1224 is about 0.45 mm, about four times of the minimum width of bottom surface 1136 of housing 1122. In addition, the minimum width of bottom surface 1236 of housing 1222 is about 0.25 mm, about twice of the minimum width of bottom surface 1136 of housing 1122. As a result, an enlarged bonding area can be provided to improve bonding between retainer 1224 and image sensor 604, and between housing 1222 and retainer 1224. In addition, with a larger bonding area, the precision requirement for application of adhesive 1138 on bottom surface 1242 can also be relaxed. It also becomes less likely that adhesive 1138 spills over from bottom surface 742 and obfuscates filter 1103 and/or pixel cells 605 of image sensor 604. All these can improve the performance of image sensor module 1200.

Although FIG. 12C illustrates that retainer 1224 includes has a rectangular footprint and that filter 1103 has a circular shape, it is understood that retainer 1224 and filter 1203 can have other geometric shapes. For example, retainer 1224 can have a cylindrical shape, whereas filter 1203 can have a rectangular/square shape.

Figure 13A:
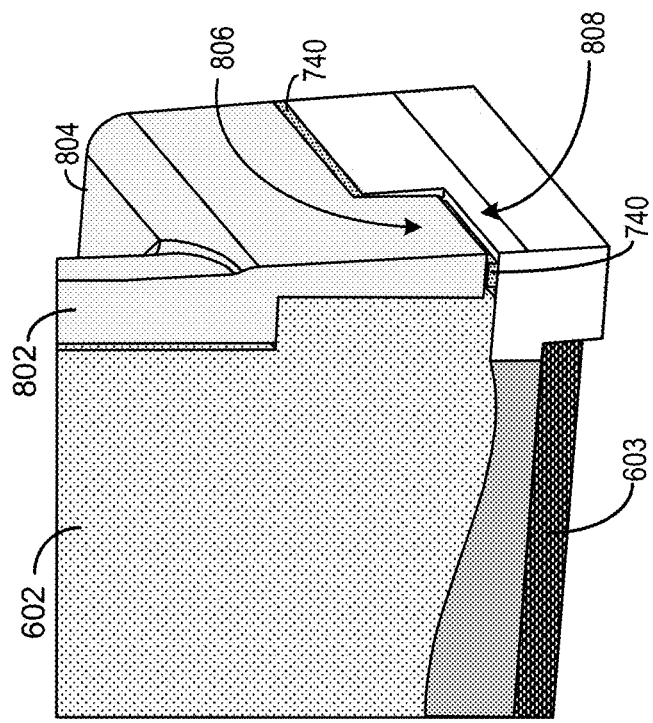
FIG. 13A and FIG. 13B illustrate examples of an image sensor module.
Figure 13A:
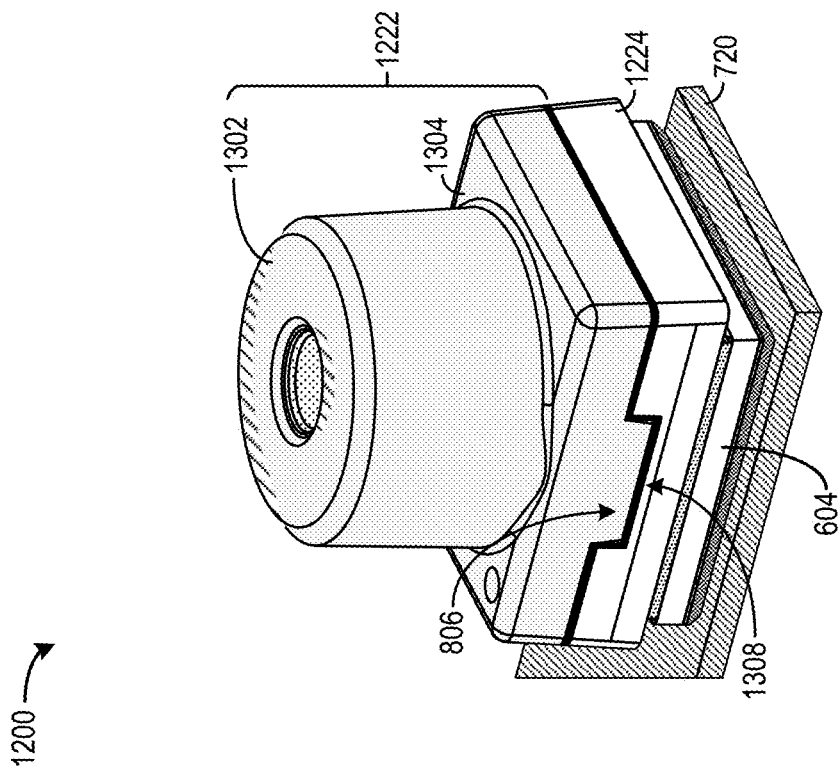
Figure 13B:
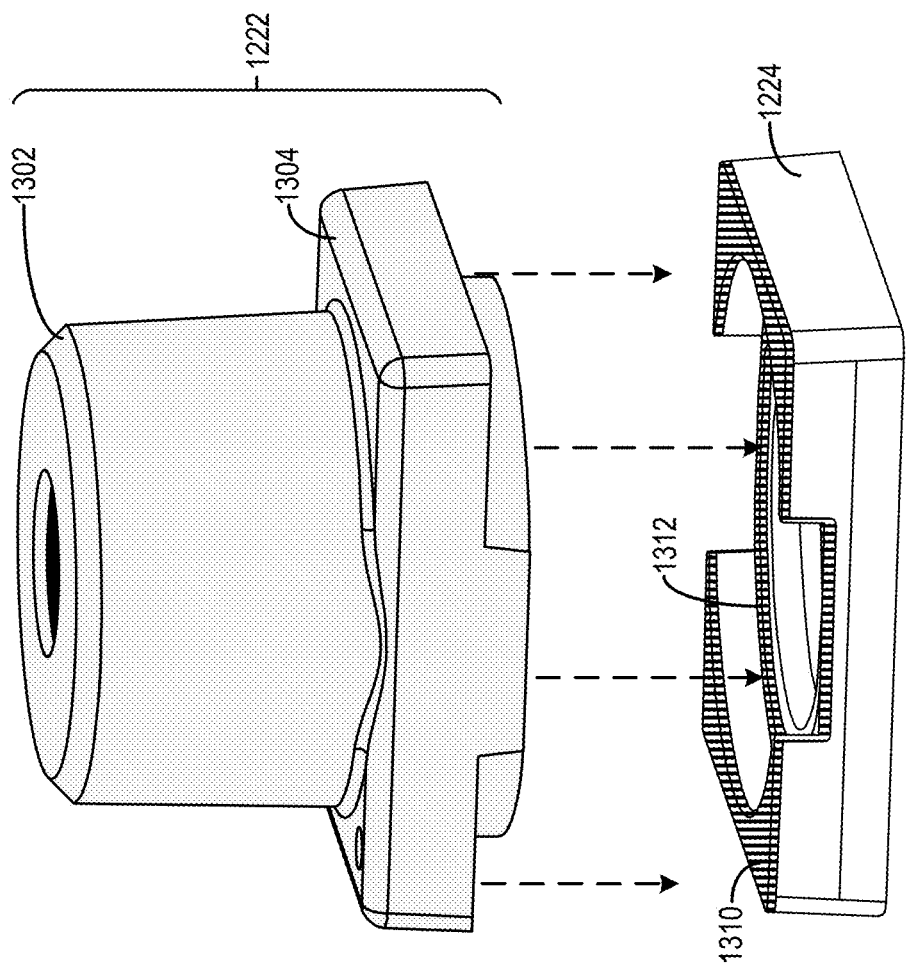

FIG. 13A and FIG. 13B illustrate examples of an image sensor module 1200 having additional features to improve bonding between housing 1222 and retainer 1224. The left of FIG. 13A illustrates an external view of image sensor module 1200, whereas the right of FIG. 13A illustrates a partial internal view of image sensor module 1200. As shown in FIG. 13A, housing 1222 can include a barrel 1302 as well as a rectangular base 1304 which surrounds a part of barrel 1302 and bonds with retainer 1224, whereas barrel 1302 surrounds and holds one or more lenses 602. Housing 1222 and retainer 1224 can include complimentary uneven bonding surfaces. The uneven bonding surfaces increases the total area for applying adhesive 1240, which can improve the bonding between housing 1222 and retainer 1224.

The complimentary uneven bonding surfaces can be provided at various locations of housing 1222 and retainer 1224. For example, as shown in FIG. 13A, the bottom of rectangular base 1304 can include a protrusion 1306 to provide an uneven bottom surface 1236, whereas the top of retainer 1224 can include a complimentary notch 1308 to provide an uneven top surface 1239. As another example, as shown in FIG. 8B, top of retainer 1224 can include, as part of uneven top surface 1239, an outer top surface 1310 and an inner top surface 1312. Outer top surface 1310 can have the same rectangular footprint and dimension as bottom surface of rectangular base 1304, and bond with the bottom surface of rectangular base 1304. Moreover, inner top surface 1312 can have the same rectangular footprint and dimension as the bottom surface of barrel 1302, and bond with the bottom surface of barrel 1302. The rectangular footprint of outer top surface 1310 and rectangular base 1304 can increase the bonding area and further improve the bonding between housing 1222 and retainer 1224.

The techniques described above in FIG. 11A-FIG. 13B can also be used to reduce the footprint and improve the performance of a light projector module, such as illuminator 130 of FIG. 1C. For example, image sensor 604 in image sensor modules 1100 and 1200 can be replaced by a light source (e.g., an light emitting diode (LED), a laser diode). Light emitted by the light source can pass through filter 1103 and one or more lenses 602 to form, for example, collimated light beams having a certain frequency range (e.g., infrared).

Figure 14A:
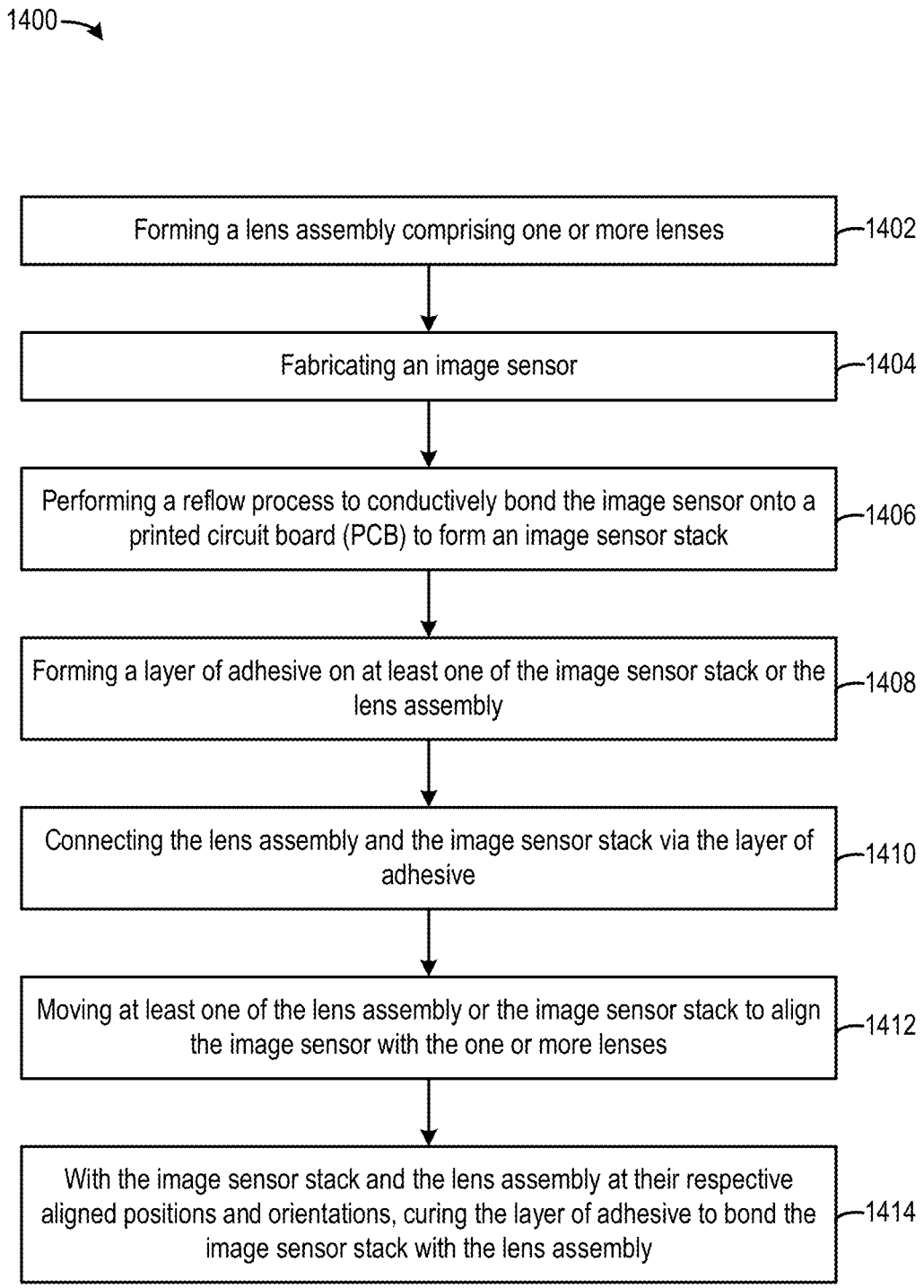
FIG. 14A, FIG. 14B, FIG. 14C, and FIG. 14D illustrate a method of forming an image sensor on a printed circuit board (PCB).
Figure 14B:
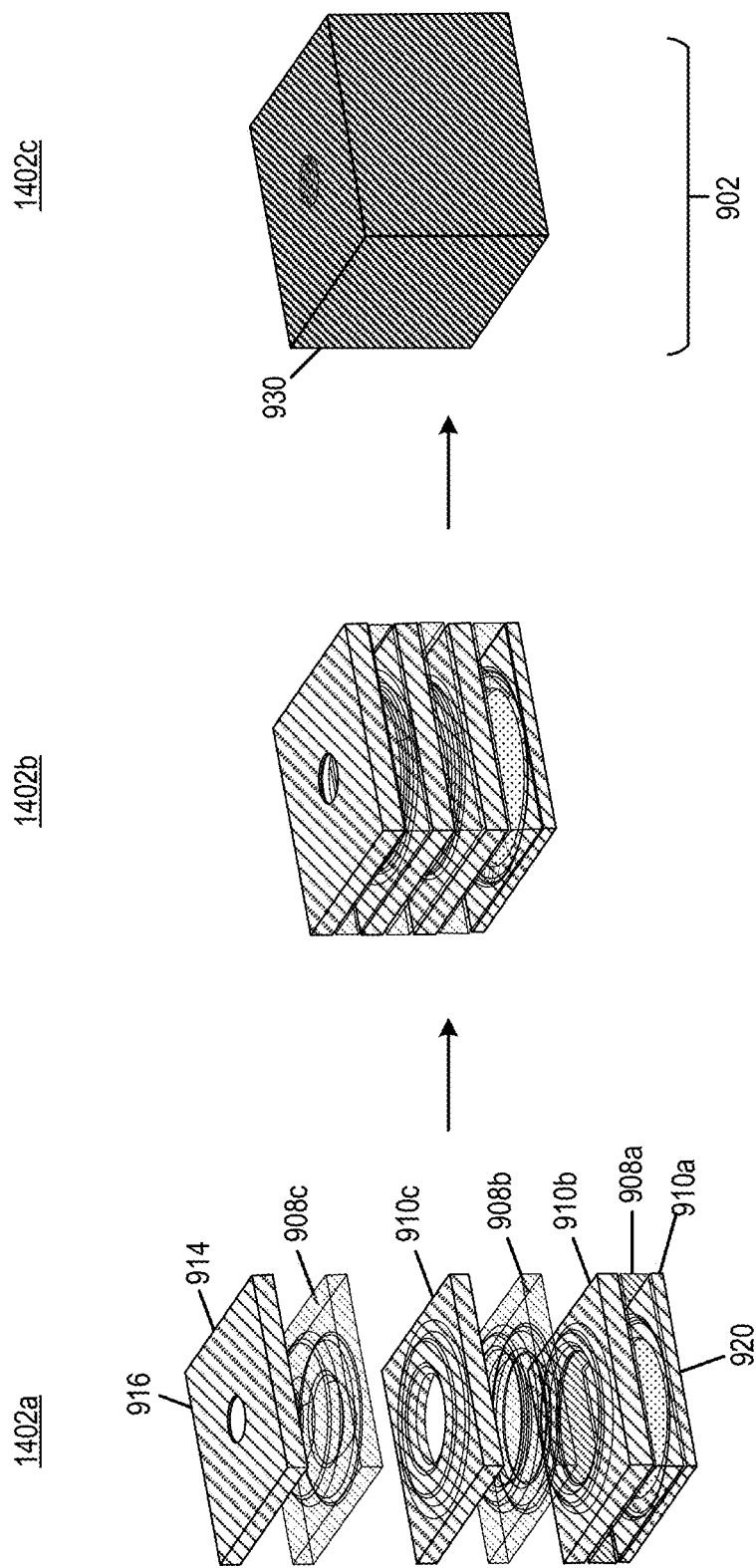

FIG. 14A-FIG. 14D illustrates a method 1400 of forming an image sensor module, such as image sensor modules 900, 1000, 1100, and 1200 of FIG. 9A-FIG. 13B, on a PCB 720. Referring to FIG. 14A, method 1400 can start with step 1402, in which a lens assembly comprising one or more lenses is formed. In some examples, referring to FIG. 14B, lens assembly 902 of image sensor module 900 can be formed by first fabricating layers 908 and polymer spacers 910 by an injection molding process, in step 1402a, followed by stacking the layers and spacers to form a lens stack, in step 1402b, and then followed by coating four sides of the lens stack with an opaque material to form coating layer 930, in step 1402c.

Figure 14C:
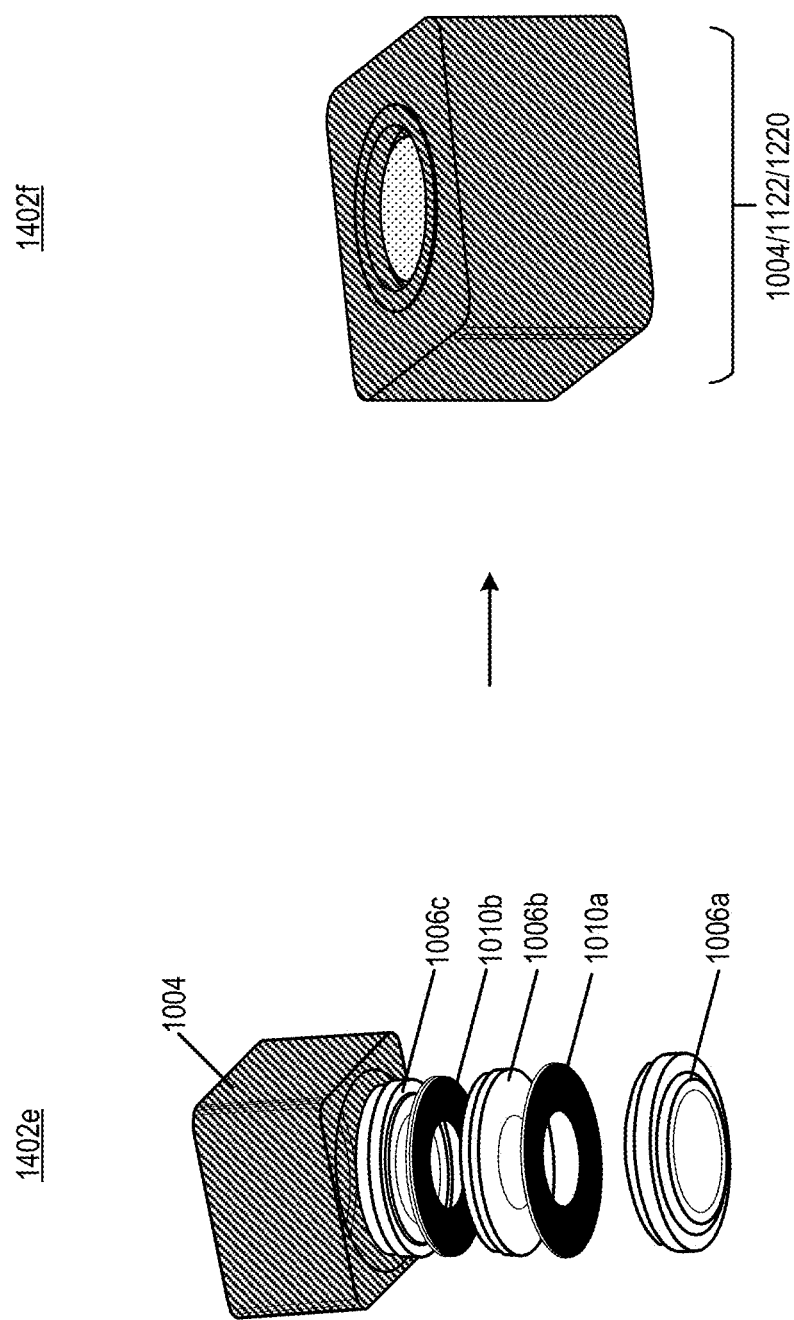

In some examples, referring to FIG. 14C, lens assembly 1002 of image sensor module 1000 can be formed by first fabricating housing 1004, layers 1006, and spacers 1010 (e.g., by an injection molding process), in step 1402e, followed by inserting the layers 1006 and spacers 1010 into housing 1004 to form lens assembly 1002, in step 1402f. In some examples, referring to FIG. 11B, one or more lenses 602, which can include lens assembly 902, can be loaded into a housing (e.g., housing 1122/1222) through a bottom opening of the housing, followed by mounting a retainer either within the housing (e.g., retainer 1124 as in FIG. 11A-FIG. 11C) or by mounting a retainer on bottom surfaces of the housing (e.g., retainer 1224 as in FIG. 12A-FIG. 13B) in step 1402f, with the retainer providing a surface to attach a filter.

Referring back to FIG. 11A, image sensor 604 can be fabricated, in step 1404. The fabrication of image sensor 604 may include fabricating an image sensor die, packaging the image sensor die in a flip-chip package, and depositing solder balls 724 on the flip-chip package. The fabrication of image sensor 604 further includes forming glass substrate 703 on light receiving surface 610 of the image sensor die.

Following step 1404, a reflow process can be performed to conductively bond image sensor 604 onto PCB 720 to form an image sensor stack, in step 1406. The reflow process can be performed to reflow solder balls 724 of the flip-chip packages into a liquid state to form conductive bonds with the contact pads of PCB 720.

Following step 1406, a layer of adhesive can be formed on at least one of the image sensor stack or the lens assembly. As shown in FIG. 9C, in a case where the adhesive is opaque upon curing, the adhesive can be formed on, for example, a perimeter of glass substrate 703 (of image sensor 604) around a region 932 facing the light outputting surface of the lens assembly. Moreover, in a case where the adhesive is clear/transparent upon curing, the adhesive can be formed in region 932 as well to bond glass substrate 703 with the light outputting surface of the lens assembly. In some examples, as described with respect to FIG. 12A-FIG. 13B, the adhesive (e.g., adhesive 1138) can be formed on a bottom surface of the retainer. The adhesive can be cured to form a bonding layer in subsequent steps.

Figure 14D:
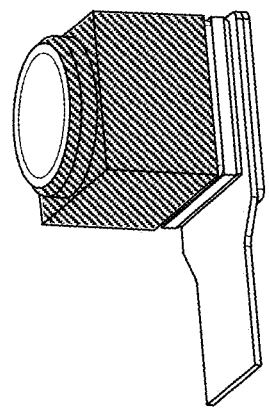
Figure 14D:
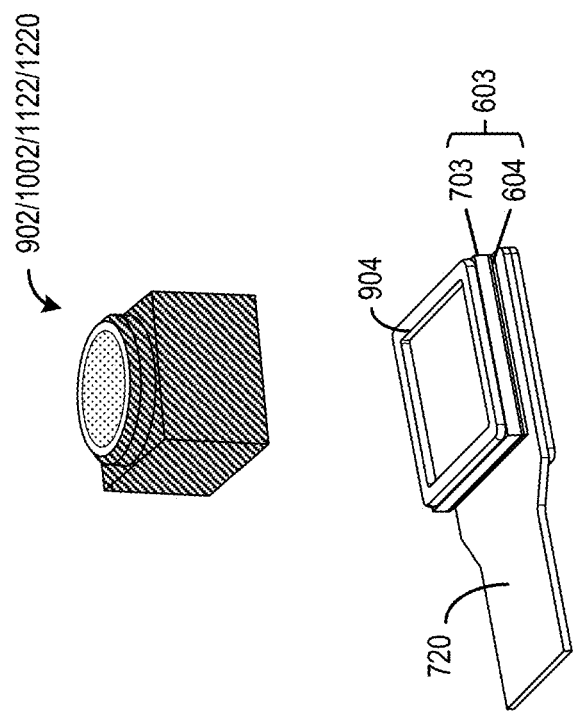

Although FIG. 14A illustrates that the fabrication of image sensor 604, the reflow process, and the formation of the adhesive layer in steps 1404 to 1408 occur after the formation of the lens assembly in step 1402, it is understood that step 1402 can be formed simultaneously or after any of steps 1404, 1406, or 1408. Referring to FIG. 14D, at the end of step 1408, a lens assembly 900/1000 and/or an image sensor module 1100/1200 comprising a holder structure 1120/1220, image sensor 604, and PCB 720 are formed.

In step 1410, the lens assembly and the image sensor stack can be brought together and connected via the layer of adhesive. In step 1412, at least one of the lens assembly or the image sensor stack can be moved to align the image sensor with the one or more lenses while the image sensor stack is connected with the lens assembly. Referring back to FIG. 9B, the movement of the image sensor stack (and/or the lens assembly) can be based on an alignment process, in which the image sensor can be controlled to generate sensor data of light received by the image sensor via the one or more lenses. A degree of alignment between the image sensor stack and the one or more lenses can be determined based on the sensor data. The position and orientation of the image sensor stack with respect to the lens assembly can be adjusted until a target degree of alignment is reached.

In step 1414, with the image sensor stack and the lens assembly at their respective aligned position and orientation, a curing process can be performed to harden the adhesive layer to form bonding layer 904 to bond the image sensor stack with the lens assembly. The curing process can be based on ultraviolet light and/or a heat process at a temperature lower than the melting point of the one or more lenses.

The techniques described above in FIG. 9A-FIG. 11D can be used to reduce the footprint and improve the performance of a light projector module, such as illuminator 130 of FIG. 1C. For example, image sensor 604 in image sensor modules 900 and 1000 can be replaced by a light source (e.g., an light emitting diode (LED), a laser diode). Light emitted by the light source can pass through lens assembly 902 to form, for example, collimated light beams. The optical properties of the light beams (e.g., dispersion, direction) can be affected by the alignment (e.g., based on the relative location and orientation) of lens assembly 902 with respect to the light source. Using the techniques described above, a light project module with reduced footprint and improved alignment between lens assembly 902 and the light source, which can lead to improved improvement, can be provided.

Additional Examples

In some examples, an apparatus is provided. The apparatus comprises: a lens assembly comprising one or more polymer layers, each layer including a lens portion and an extension portion; and an image sensor below the lens assembly and bonded to the lens assembly via a bonding layer and configured to sense light that passes through the lens portion of the one or more polymer layers.

In some aspects, each of the one or more polymer layers is made of a cyclic olefin copolymer (COC) material.

In some aspects, each of the one or more polymer layers is made of at least one of: a polycarbonate material, or a polyester material.

In some aspects, each of the one or more polymer layers is made from one or more injection molding processes.

In some aspects, a footprint of the lens assembly is substantially identical to a footprint of the image sensor.

In some aspects, the bonding layer is distributed around a perimeter of the image sensor to surround a light receiving surface of the image sensor facing the lens portions of the one or more polymer layers.

In some aspects, the lens assembly further comprises a light outputting surface. The bonding layer is distributed over a light receiving surface of the image sensor to bond the light receiving surface of the image sensor with the light outputting surface of the lens assembly.

In some aspects, the one or more polymer layers comprise a plurality of polymer layers. The extension portion of a pair of polymer layers of the plurality of polymer layers are bonded via an adhesive.

In some aspects, the one or more polymer layers comprise a plurality of polymer layers. The lens assembly further includes a plurality of spacers comprising a first spacer, the first spacer being sandwiched between the extension portions of a pair of polymer layers of the plurality of polymer layers.

In some aspects, the first spacer is bonded to the extension portions of the pair of polymer layers.

In some aspects, the plurality of spacers are made of an opaque material comprising one of: a polymer, or a metal.

In some aspects, the one or more polymer layers comprise a plurality of polymer layers. The lens portion of a pair of polymer layers of the plurality of polymer layers are bonded via an adhesive.

In some aspects, the apparatus further comprises an opaque coating on exterior surfaces of the lens assembly, wherein the exterior surfaces do not face the image sensor.

In some aspects, the image sensor comprises a substantially flat substrate and an integrated circuit die. The light sensed by the image sensor passes through the substrate. The lens assembly is bonded to the substrate.

In some aspects, the apparatus further comprises a printed circuit board (PCB). The image sensor die is conductively bonded to the PCB.

In some aspects, the image sensor is conductively bonded with the PCB via solder balls by a reflow process.

In some aspects, a temperature of the reflow process is higher than a melting temperature of the one or more polymer layers.

In some aspects, the bonding layer is formed by a curing process at a temperature lower than a temperature of the reflow process to bond the image sensor to the lens assembly.

In some aspects, the PCB provides mechanical support for the image sensor. The PCB, the image sensor, and the bonding layer provide mechanical support for the lens assembly.

In some aspects, the bonding layer is formed by a curing processing involving an ultraviolet light to bond the image sensor to the lens assembly.

In some examples, an apparatus is provided. The apparatus comprises: a lens assembly comprising a first layer and a second layer, each of the first layer and second layer including a lens portion and an extension portion, at least of the lens portion or the extension portion of the first layer being bonded with, respectively, the lens portion or the extension portion of the second layer to form a lens stack; and an image sensor below the lens assembly and bonded to the lens assembly via a bonding layer and configured to sense light that passes through the lens portions of the first layer and the second layer.

In some aspects, each of the first layer and the second layer is made of a glass material.

In some examples, an apparatus is provided. The apparatus comprises: a lens assembly comprising a first layer, a second layer, and a spacer sandwiched between the first layer and the second layer, each of the first layer and a second layer including a lens portion and an extension portion, the extension portions of the first layer and the second layer being bonded with the spacer; and an image sensor below the lens assembly and bonded to the lens assembly via a bonding layer and configured to sense light that passes through the lens portions of the first layer and the second layer.

In some aspects, wherein each of the first layer and the second layer is made of a glass material.

In some examples, an apparatus is provided. The apparatus comprises: one or more lenses, an opaque lens holder to hold the one or more lens, and an image sensor below the lens assembly and bonded to the lens assembly via a bonding layer, the image sensor configured to sense light that passes through the one or more lenses.

In some aspects, the one or more lenses comprise a polymer material.

In some aspects, wherein a footprint of the lens assembly is substantially identical to a footprint of the image sensor.

In some aspects, the bonding layer is distributed between a perimeter of the image sensor and the lens holder.

In some aspects, the lens assembly further comprises a light outputting surface surrounded by the lens holder. The bonding layer is distributed over a light receiving surface of the image sensor to bond the light outputting surface of the lens assembly with the light receiving surface of the image sensor.

In some aspects, the lens holder holds the one or more lenses at one or more first locations and sets one or more first orientations of the one or more lenses.

In some aspects, the image sensor is bonded to the lens holder at a second location and having a second orientation with respect to the lens assembly. The second location and the second orientation of the image sensor are based on, respectively, the one or more first locations and the one or more first orientations of the one or more lenses.

In some aspects, the one or more lenses comprise a plurality of lenses.

In some aspects, the lens assembly further comprises a plurality of spacers, a first spacer of the plurality of spacers being sandwiched between a pair of lenses of the plurality of lenses.

In some aspects, the plurality of spacers are made of an opaque material comprising one of: a polymer, or a metal.

In some aspects, the opaque lens holder comprises a housing and a retainer. The housing is configured to hold the one or more lenses. The retainer is configured to retain the one or more lenses within the housing.

In some aspects, the retainer is positioned within the housing.

In some aspects, at least a part of the retainer is sandwiched between the housing and the image sensor.

In some aspects, the housing includes a top opening to receive the light and a bottom opening to output the light to the image sensor. The one or more lenses are mounted at pre-determined positions within the housing between the top opening and bottom opening. The housing includes a first bottom surface surrounding the bottom opening and bonded with a top surface of the retainer via a first adhesive.

In some aspects, the first bottom surface of the housing is bonded with an outer portion of the top surface of the retainer via the first layer of adhesive. An inner portion of the top surface of the retainer is in contact with the one or more lenses to prevent the one or more lenses from falling out of the bottom opening.

In some aspects, the retainer is further configured to hold a filter to filter the light before the light is detected by the image sensor.

In some aspects, the retainer includes a middle surface to mount the filter, and a second bottom surface to bond with the image sensor via a second adhesive.

In some aspects, the filter comprises an array of filters.

In some aspects, the image sensor comprises an image sensor die, and the second bottom surface is bonded with the image sensor die via the second adhesive.

In some aspects, a length and a width of a footprint of the apparatus on a PCB is less than 5 millimeter (mm). A narrowest width of the second bottom surface of the retainer is longer than 0.4 mm.

In some aspects, the first bottom surface of the housing comprises a first uneven surface. The top surface of the retainer comprises a second uneven surface. The first uneven surface and the second uneven surface are complimentary to each other and are bonded with each other via the first adhesive.

In some aspects, the housing comprises a barrel and a base portion. The base portion includes the first uneven surface to bond with the second uneven surface of the retainer.

In some aspects, the housing comprises a barrel and a base portion surrounding at least a part of the barrel. The base portion and the barrel include, respectively, an outer bottom surface and an inner bottom surface as the first uneven surface. The top surface of the retainer includes an outer top surface and an inner top surface as the second uneven surface. The outer bottom surface of the base portion is bonded with the outer top surface of the retainer via the first adhesive. The inner bottom surface of the barrel is bonded with the inner top surface of the retainer via the first adhesive.

In some aspects, the housing and the retainer are made of a polymer material using an injection molding process.

In some examples, a method comprises: forming a lens assembly comprising one or more lenses; performing a reflow process to conductively bond an image sensor onto a printed circuit board (PCB) to form an image sensor stack; forming a layer of adhesive on at least one of the image sensor stack or the lens assembly; connecting the lens assembly and the image sensor stack via the layer of adhesive; moving at least one of the lens assembly or the image sensor stack to align the image sensor with the one or more lenses; and with the image sensor stack and the lens assembly at their respective aligned positions and orientations, curing the layer of adhesive to bond the image sensor stack with the lens assembly.

In some aspects, forming the lens assembly comprises fabricating each of the one or more lenses using a mold-injection process.

In some aspects, forming the lens assembly comprises enclosing the one or more lenses in an opaque lens holder to form the lens assembly.

In some aspects, forming the lens assembly comprises loading the one or more lenses into a housing and attaching a retainer on a bottom surface of the housing to prevent the one or more lenses from falling out of the housing.

In some aspects, the one or more lenses comprise a plurality of lenses. Forming the lens assembly comprises: stacking the plurality of lenses with a plurality of spacers to form a lens stack, wherein each pair of lens of the plurality of lenses is separated by an opaque spacer of the plurality of spacers in the lens stack; and coating four sides of the lens stack with an opaque material.

In some aspects, the method further comprises: fabricating an image sensor die; packaging the image sensor die in a flip-chip package; depositing solder balls on the flip-chip package; and bringing the flip-chip packages having the solder balls into contact with contact pads of the PCB. The reflow process is performed to reflow the solder balls of the flip-chip packages into a liquid state to form conductive bonds with the contact pads.

In some aspects, the method further comprises forming a glass substrate on a light receiving surface of the image sensor die.

In some aspects, the layer of adhesive is formed on a perimeter of the glass substrate.

In some aspects, the lens assembly further comprises a light outputting surface. The layer of adhesive is distributed on a region of glass substrate to bond with the light outputting surface.

In some aspects, moving at least one of the lens assembly or the image sensor stack to align the image sensor with the one or more lenses comprises: controlling the image sensor to generate sensor data of light received by the image sensor via the one or more lenses; determining a degree of alignment between the image sensor and the one or more lenses based on the sensor data; and moving at least one of the lens assembly or the image sensor stack based on the degree of alignment.

In some aspects, curing the layer of adhesive comprises subjecting the layer of adhesive to ultraviolet light.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the examples is intended to be illustrative, but not limiting, of the scope of the disclosure, which is set forth in the following claims.

What is claimed is:

1. An apparatus comprising:
    a lens assembly comprising:
        a plurality of polymer layers comprising a first polymer layer and a second polymer layer forming a stack, the first polymer layer including a lens portion and an extension portion, the second polymer layer including a lens portion; and
        a rigid spacer having an opening and sandwiched between the first polymer layer and the second polymer layer, the extension portion of the first polymer layer being mechanically supported on and bonded to the rigid spacer via a first bonding layer to allow the lens portion of the first polymer layer to be suspended over the opening and over the lens portion of the second polymer layer; and
    an image sensor positioned below the lens assembly and bonded to the lens assembly via a second bonding layer and configured to sense light that passes through the lens portions of the plurality of polymer layers.

2. The apparatus of claim 1, wherein each of the plurality of polymer layers is made of a cyclic olefin copolymer (COC) material.

3. The apparatus of claim 1, wherein each of the plurality of polymer layers is made of at least one of: a polycarbonate material, or a polyester material.

4. The apparatus of claim 1, wherein each of the plurality of polymer layers is made from one or more injection molding processes.

5. The apparatus of claim 1, wherein a footprint of the lens assembly is substantially identical to a footprint of the image sensor.

6. The apparatus of claim 1, wherein the second bonding layer is distributed around a perimeter of the image sensor to surround a light receiving surface of the image sensor facing the lens portions of the plurality of polymer layers.

7. The apparatus of claim 1, wherein the lens assembly further comprises a light outputting surface; and
    wherein the second bonding layer is distributed over a light receiving surface of the image sensor to bond the light receiving surface of the image sensor with the light outputting surface of the lens assembly.

8. The apparatus of claim 1, wherein the rigid spacer is plurality of spacers arc made of an opaque material comprising one of: a polymer, or a metal.

9. The apparatus of claim 1, further comprising an opaque coating on exterior surfaces of the lens assembly, wherein the exterior surfaces do not face the image sensor.

10. The apparatus of claim 1, further comprising an opaque lens holder to hold a single stack of the plurality of polymer layers;
    wherein the opaque lens holder comprises a housing and a retainer;
    wherein the housing is configured to hold the plurality of polymer layers;
    wherein the retainer is configured to retain the plurality of polymer layers within the housing; and
    wherein the image sensor is bonded to either the housing or the retainer.

11. The apparatus of claim 10, wherein at least a part of the retainer is sandwiched between the housing and the image sensor.

12. The apparatus of claim 11, wherein the housing includes a first bottom surface surrounding a bottom opening of the housing facing the retainer and bonded with a top surface of the retainer via a first adhesive.

13. The apparatus of claim 12, wherein the retainer includes a middle surface to mount a filter, and a second bottom surface to bond with the image sensor via a second adhesive.

14. The apparatus of claim 13, wherein the first bottom surface of the housing comprises a first uneven surface;

wherein the top surface of the retainer comprises a second uneven surface;

wherein the first uneven surface and the second uneven surface are complimentary to each other and are bonded with each other via the first adhesive.

15. The apparatus of claim 14, wherein the housing comprises a barrel and a base portion;

wherein the base portion includes the first uneven surface to bond with the second uneven surface of the retainer.

16. The apparatus of claim 15, wherein the housing and the retainer are made of a polymer material using an injection molding process.

17. The apparatus of claim 1, wherein the image sensor comprises a glass substrate and an image sensor die;

wherein the second bonding layer is formed between the glass substrate and the lens assembly.

18. The apparatus of claim 11, wherein the image sensor is bonded to the retainer.

19. The apparatus of claim 11, further comprising a filter mounted within the retainer.

* * * * *